(12) United States Patent
Kawabata

(10) Patent No.: US 12,392,458 B2
(45) Date of Patent: Aug. 19, 2025

(54) LED LAMP

(71) Applicant: Rohm Co., Ltd., Kyoto (JP)

(72) Inventor: Yusaku Kawabata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 116 days.

(21) Appl. No.: 18/166,374

(22) Filed: Feb. 8, 2023

(65) Prior Publication Data

US 2023/0184394 A1 Jun. 15, 2023

Related U.S. Application Data

(63) Continuation of application No. 17/235,784, filed on Apr. 20, 2021, now Pat. No. 11,608,941, which is a
(Continued)

(51) Int. Cl.

| | |
|---|---|
| *F21K 9/233* | (2016.01) |
| *F21K 9/27* | (2016.01) |
| *F21K 9/68* | (2016.01) |
| *F21Y 103/10* | (2016.01) |
| *F21Y 105/10* | (2016.01) |
| *F21Y 115/10* | (2016.01) |
| *H01L 25/075* | (2006.01) |
| *H10H 20/853* | (2025.01) |

(Continued)

(52) U.S. Cl.
CPC ............... *F21K 9/233* (2016.08); *F21K 9/27* (2016.08); *F21K 9/68* (2016.08); *H01L 25/0753* (2013.01); *H10H 20/853* (2025.01); *H10H 20/856* (2025.01); *H10H 20/857* (2025.01); *F21Y 2103/10* (2016.08); *F21Y 2105/10* (2016.08); *F21Y 2115/10* (2016.08); *H01L 2224/48091* (2013.01); *H01L 2224/48227* (2013.01); *H01L 2924/01021* (2013.01); *H10H 20/855* (2025.01)

(58) Field of Classification Search
CPC .......... Y10S 362/80; F21S 4/20; F21S 2/005; F21K 9/278; F21K 9/20; F21K 9/00; F21V 7/005; F21V 15/013; F21V 19/003; F21V 29/507; F21V 3/02; F21V 3/0625; H01L 23/49541
See application file for complete search history.

(56) References Cited

U.S. PATENT DOCUMENTS

| | | | |
|---|---|---|---|
| 6,250,774 B1 | 6/2001 | Begemann et al. | |
| 6,376,902 B1 * | 4/2002 | Arndt | H10H 20/8585 257/432 |

(Continued)

FOREIGN PATENT DOCUMENTS

| | | |
|---|---|---|
| CN | 201081165 Y | 7/2008 |
| JP | 63-95261 | 6/1988 |

(Continued)

*Primary Examiner* — Edward Chin
(74) *Attorney, Agent, or Firm* — HSML P.C.

(57) ABSTRACT

An LED lamp A includes a plurality of LED modules 2 each including an LED chip 21, and a support member 1 including a support surface 1a on which the LED modules 2 are mounted. The LED modules 2 include a plurality of kinds of LED modules, or a first through a third LED modules 2A, 2B and 2C different from each other in directivity characteristics that represent light intensity distribution with respect to light emission directions. This arrangement ensures that the entire surrounding area can be illuminated with sufficient brightness.

13 Claims, 34 Drawing Sheets

Related U.S. Application Data continuation of application No. 17/008,007, filed on Aug. 31, 2020, now Pat. No. 11,629,826, which is a continuation of application No. 16/242,090, filed on Jan. 8, 2019, now abandoned, which is a continuation of application No. 15/707,759, filed on Sep. 18, 2017, now Pat. No. 10,190,729, which is a continuation of application No. 14/968,100, filed on Dec. 14, 2015, now Pat. No. 9,797,554, which is a continuation of application No. 13/202,910, filed as application No. PCT/JP2010/052870 on Feb. 24, 2010, now Pat. No. 9,234,632.

(51) Int. Cl.
*H10H 20/855* (2025.01)
*H10H 20/856* (2025.01)
*H10H 20/857* (2025.01)

(56) References Cited

U.S. PATENT DOCUMENTS

| | | | |
|---|---|---|---|
| 6,975,011 B2 * | 12/2005 | Arndt | H10H 20/856 257/E31.118 |
| 7,066,626 B2 * | 6/2006 | Omata | H10H 20/8506 362/257 |
| 7,311,423 B2 | 12/2007 | Frecska et al. | |
| 7,635,915 B2 * | 12/2009 | Xie | H10H 20/8585 257/E23.06 |
| 7,756,413 B2 | 7/2010 | Matsui | |
| 7,868,345 B2 | 1/2011 | Mori et al. | |
| 7,997,770 B1 | 8/2011 | Meurer | |
| 8,029,159 B2 | 10/2011 | Chen | |
| 8,164,102 B2 * | 4/2012 | Furukawa | H01L 25/0753 257/E33.059 |
| 8,330,362 B2 | 12/2012 | Lin | |
| 8,360,599 B2 | 1/2013 | Ivey et al. | |
| 8,362,605 B2 * | 1/2013 | Xie | H10H 20/857 257/692 |
| 8,368,112 B2 * | 2/2013 | Chan | H10H 20/857 257/89 |
| 8,901,823 B2 | 12/2014 | Scapa | |
| 9,711,491 B2 * | 7/2017 | Marutani | H10H 20/857 |
| 10,230,036 B2 * | 3/2019 | Yoon | H10H 20/831 |
| 10,340,433 B2 | 7/2019 | Lee et al. | |
| 2001/0017568 A1 | 8/2001 | Kasa et al. | |
| 2002/0060526 A1 | 5/2002 | Timmermans et al. | |
| 2002/0190262 A1 * | 12/2002 | Nitta | H01L 25/167 257/E33.059 |
| 2003/0080341 A1 * | 5/2003 | Sakano | B29C 67/08 257/E33.059 |
| 2005/0133808 A1 | 6/2005 | Uraya et al. | |
| 2005/0156187 A1 * | 7/2005 | Isokawa | H01L 23/49838 257/E23.07 |
| 2006/0049477 A1 * | 3/2006 | Arndt | H10H 20/857 257/432 |
| 2006/0203493 A1 * | 9/2006 | Brower | F21V 11/02 362/342 |
| 2006/0205237 A1 | 9/2006 | Kodama et al. | |
| 2006/0208268 A1 | 9/2006 | Ueno et al. | |
| 2006/0268555 A1 * | 11/2006 | Kelly | F21L 14/023 362/341 |
| 2007/0030676 A1 * | 2/2007 | Ichihara | F21K 9/00 257/E33.059 |
| 2007/0064425 A1 * | 3/2007 | Frecska | F21S 4/28 362/253 |
| 2007/0181900 A1 | 8/2007 | Sato et al. | |
| 2007/0200127 A1 | 8/2007 | Andrews | |
| 2007/0201225 A1 * | 8/2007 | Holder | F21V 5/04 257/E33.073 |
| 2007/0252250 A1 * | 11/2007 | Hui | H10H 20/857 257/672 |
| 2008/0062689 A1 | 3/2008 | Villard | |
| 2008/0094837 A1 | 4/2008 | Dobbins et al. | |
| 2008/0117355 A1 | 5/2008 | Mori | |
| 2008/0186714 A1 * | 8/2008 | Nagayama | H10H 20/8506 362/308 |
| 2008/0217640 A1 | 9/2008 | Suzuki | |
| 2008/0237627 A1 * | 10/2008 | Kobayakawa | H10H 20/857 257/E33.058 |
| 2008/0258168 A1 * | 10/2008 | Loh | H10H 20/852 257/E33.001 |
| 2008/0283862 A1 | 11/2008 | Fujii | |
| 2008/0296590 A1 * | 12/2008 | Ng | H10H 20/8506 438/28 |
| 2009/0045422 A1 | 2/2009 | Kato et al. | |
| 2009/0072251 A1 * | 3/2009 | Chan | H01L 25/0753 257/E33.059 |
| 2009/0140271 A1 | 6/2009 | Sah | |
| 2009/0323330 A1 | 12/2009 | Gordin et al. | |
| 2010/0214780 A1 * | 8/2010 | Villard | F21V 19/02 362/249.02 |
| 2010/0284195 A1 * | 11/2010 | Liu | F21V 23/008 362/373 |
| 2011/0042124 A1 | 2/2011 | Matsui et al. | |
| 2011/0216537 A1 * | 9/2011 | Holder | F21V 31/005 362/311.01 |
| 2011/0255276 A1 * | 10/2011 | Coward | F21V 14/02 362/217.02 |
| 2011/0303936 A1 * | 12/2011 | Wu | H10H 20/857 438/27 |
| 2012/0049203 A1 | 3/2012 | Mondada et al. | |
| 2012/0104426 A1 | 5/2012 | Chan et al. | |
| 2012/0126260 A1 | 5/2012 | Hussell et al. | |
| 2013/0003370 A1 * | 1/2013 | Watanabe | F21S 8/086 362/244 |
| 2013/0069089 A1 | 3/2013 | Hussel et al. | |
| 2013/0135853 A1 * | 5/2013 | Lin | G02B 6/002 385/39 |
| 2013/0258668 A1 | 10/2013 | Dellian et al. | |
| 2014/0151731 A1 | 6/2014 | Tran | |
| 2014/0256072 A1 * | 9/2014 | Loh | H10H 20/8506 438/28 |
| 2015/0014838 A1 | 1/2015 | Yap | |

FOREIGN PATENT DOCUMENTS

| | | | | |
|---|---|---|---|---|
| JP | 4-92660 U | | 8/1991 | |
| JP | 6-54103 U | | 7/1994 | |
| JP | H10294495 A | * | 11/1998 | |
| JP | 11-17228 A | | 1/1999 | |
| JP | 11-306811 A | | 11/1999 | |
| JP | 2002033517 A | * | 1/2002 | |
| JP | 2002-197901 A | | 7/2002 | |
| JP | 2003051618 A | * | 2/2003 | |
| JP | 2004-109407 A | | 4/2004 | |
| JP | 2005-159263 A | | 6/2005 | |
| JP | 3707024 B2 | * | 10/2005 | |
| JP | 2008-258094 A | | 10/2008 | |
| JP | 3145640 U | | 10/2008 | |
| JP | 2008251937 A | * | 10/2008 | H01L 23/49541 |
| JP | 3148527 U | | 2/2009 | |
| JP | 2009252375 A | * | 10/2009 | |
| JP | 4482193 B2 | * | 6/2010 | H01R 13/6315 |
| KR | 20070006733 A | * | 1/2007 | |
| KR | 20080066635 A | * | 7/2008 | |
| KR | 20080088891 A | * | 10/2008 | |
| KR | 100866586 B1 | * | 11/2008 | |
| KR | 20090044789 A | * | 5/2009 | |
| WO | WO-2009049824 A1 | * | 4/2009 | F21K 9/00 |
| WO | WO-2009142449 A2 | * | 11/2009 | F21K 9/00 |
| WO | WO-2010117210 A2 | * | 10/2010 | F21K 9/00 |

* cited by examiner

LED LAMP

TECHNICAL FIELD

The present invention relates to an LED lamp that uses a light emitting diode (hereinafter referred to as "LED") as the light source.

BACKGROUND ART

FIG. 63 shows an example of conventional LED lamp (see Patent Document 1, for example). The LED lamp X shown in the figure includes a plate-like substrate 91, a plurality of LED modules 92 mounted on the substrate 91, a heat dissipation member 95 attached to the substrate 91, a case 93 accommodating the substrate 91, and terminals 94. The substrate 91 is provided with a wiring pattern, not shown, connected to the LED modules 92 and the terminal 94. The LED lamp X is structured such that the LED modules 92 can be turned on when the terminals 94 are fitted into inlet ports of a socket of a general-use fluorescent lighting fixture.

The general-use fluorescent lighting fixture herein refers to lighting fixtures widely used for interior lighting as the main application, and more specifically, lighting fixtures which use, for example in Japan, a commercial power supply (e.g. AC 100 v) and to which a JIS C7617 straight-tube fluorescent lamp or a JIS C7618 circular fluorescent lamp can be attached. (Hereinafter, such a general-use fluorescent lighting fixture is simply referred to as a "lighting fixture".)

When the LED lamp X is attached to a lighting fixture on e.g. an indoor ceiling, the main light emission direction of the LED modules 92 is oriented downward. When the LED modules 92 are turned on, most part of the light emitted from the LED modules 92 is directed in the main light emission direction of the LED modules 92. Thus, sufficient brightness cannot be obtained at the surrounding area of the LED lamp X, especially near the sides of the LED lamp X.

As compared with this, general-use fluorescent lamps can emit light from almost the entire surface of the case, so that the surrounding area of the lighting fixture is uniformly illuminated to obtain sufficient brightness. Thus, as compared with general-use fluorescent lamps, the LED lamp X has a disadvantage that sufficient brightness cannot be obtained especially near the sides of the lamp.

Patent Document 1: JP-U-H06-54103

SUMMARY OF THE INVENTION

Problems to be Solved by the Invention

The present invention has been proposed under the circumstances described above. It is therefore an object of the present invention to provide an LED lamp that can illuminate the surrounding area with sufficient brightness.

Means for Solving the Problem

According to the present invention, there is provided an LED lamp comprising a plurality of LED modules each including an LED chip and a support member including a support surface on which the LED modules are mounted. The LED modules comprise a plurality of kinds of LED modules different from each other in directivity characteristics that represent light intensity distribution with respect to a light emission direction.

In a preferred embodiment of the present invention, the plurality of LED modules include a first LED module arranged adjacent to the center of the support surface. The directivity characteristics of the first LED module are such that light intensity in the normal direction of the support surface is relatively high, as compared with other LED modules.

In a preferred embodiment of the present invention, the first LED module includes a reflector that surrounds the LED chip and that is open in the normal direction.

In a preferred embodiment of the present invention, the first LED module further includes a sealing resin that seals the LED chip. The sealing resin is filled in a space surrounded by the reflector.

In a preferred embodiment of the present invention, the dimension of the first LED module in the normal direction of the support surface of the support member is smaller than a dimension of the first LED module in the in-plane direction of the support surface.

In a preferred embodiment of the present invention, the first LED module includes a substrate on which the LED chip is mounted, and the substrate is provided with a mount terminal on a surface thereof opposite from a surface on which the LED chip is mounted.

In a preferred embodiment of the present invention, the plurality of LED modules include a second LED module arranged adjacent to an edge of the support surface. The directivity characteristics of the second LED module are such that light intensity in an outward direction within the plane of the support surface is relatively high, as compared with other LED modules.

In a preferred embodiment of the present invention, the second LED module includes a reflector that surrounds the LED chip and that is open in the outward direction within the plane of the support surface.

In a preferred embodiment of the present invention, the second LED module further includes a sealing resin that seals the LED chip. the sealing resin is filled in a space surrounded by the reflector.

In a preferred embodiment of the present invention, the second LED module includes a substrate on which the LED chip is mounted. The second LED module is mounted on the support member, with a side surface of the substrate facing the support surface of the support member.

In a preferred embodiment of the present invention, a dimension of the second LED module in an in-plane direction of the support member is larger than the dimension of the second LED module in the normal direction of the support member.

In a preferred embodiment of the present invention, the plurality of LED modules further include a third LED module arranged between the first LED module and the second LED module. The directivity characteristics of the third LED module are such that the light intensity distribution with respect to the light emission direction is relatively uniform, as compared with the first and the second LED modules.

In a preferred embodiment of the present invention, the third LED module includes a substrate on which the LED chip is mounted, and the substrate is provided with amount terminal on a surface thereof opposite from the surface on which the LED chip is mounted.

In a preferred embodiment of the present invention, the third LED module includes a sealing resin that seals the LED chip. The sealing resin is exposed in both of the normal direction of the support surface and the in-plane direction of the support surface.

In a preferred embodiment of the present invention, the support surface has an elongated shape. A plurality of first LED modules are arranged in the longitudinal direction of the support surface adjacent to the center of the support surface. A plurality of second LED modules are arranged along edges of the support surface that are spaced from each other in the width direction. A plurality of third LED modules are arranged in the longitudinal direction at each of the regions between the first LED modules and the second LED modules.

In a preferred embodiment of the present invention, the LED lamp further comprises a case that accommodates the first through the third LED modules and the support member and allows light emitted from the first through the third LED modules to pass through while diffusing the light.

In a preferred embodiment of the present invention, the case is cylindrical.

In a preferred embodiment of the present invention, the support member comprises an insulating substrate, and the LED lamp further comprises a heat dissipation member attached to the insulating substrate at a portion opposite from the support surface.

In a preferred embodiment of the present invention, the case is formed with a projecting piece that projects inward and supports the substrate.

In a preferred embodiment of the present invention, the projecting piece is in engagement with the heat dissipation member.

Other features and advantages of the present invention will become more apparent from the detailed description given below with reference to the accompanying drawings.

MODE FOR CARRYING OUT THE INVENTION

Preferred embodiments of the present invention are described below with reference to the accompanying drawings.

Figure 1:
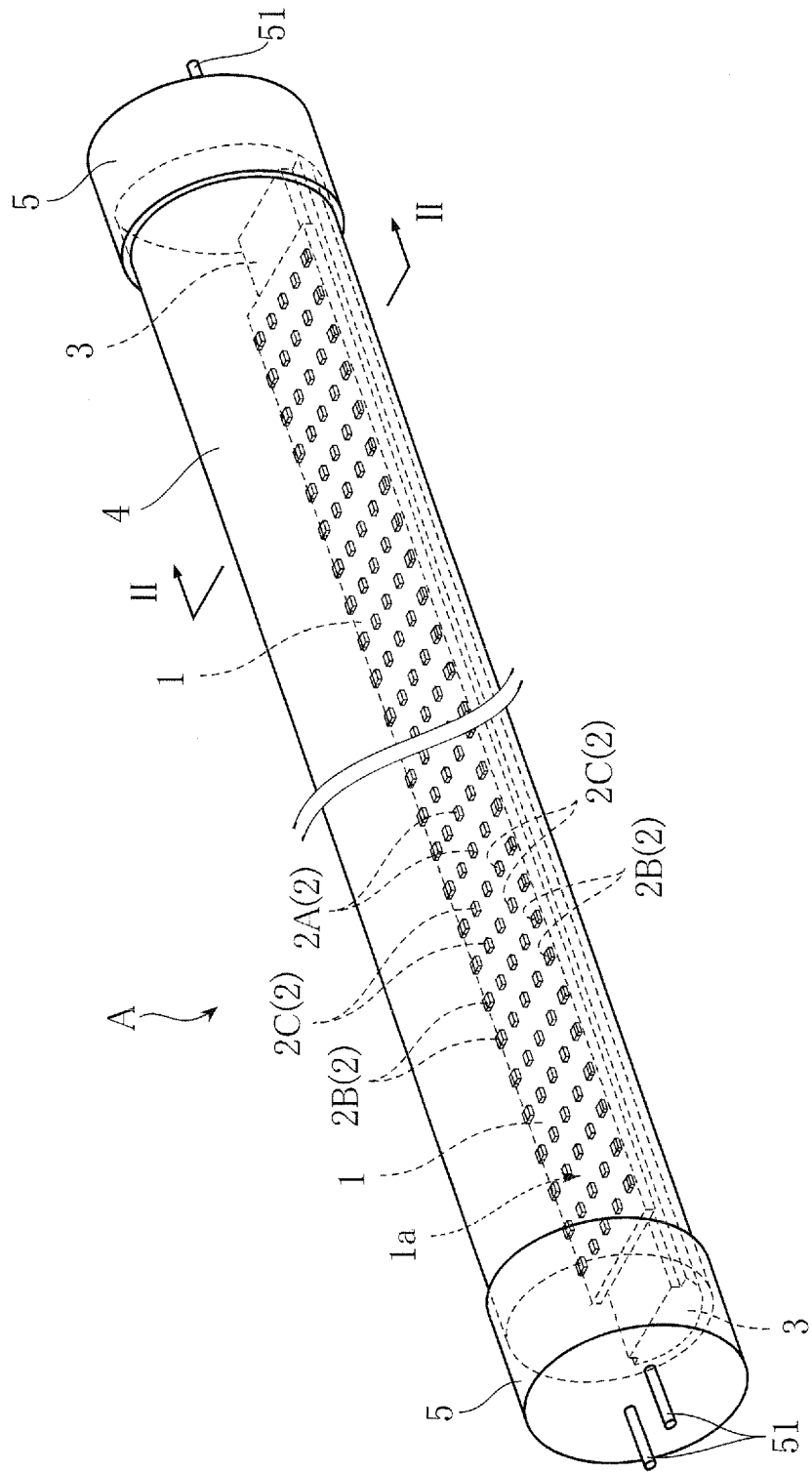
FIG. 1 is a perspective view showing an example of LED lamp according to the present invention.
Figure 2:
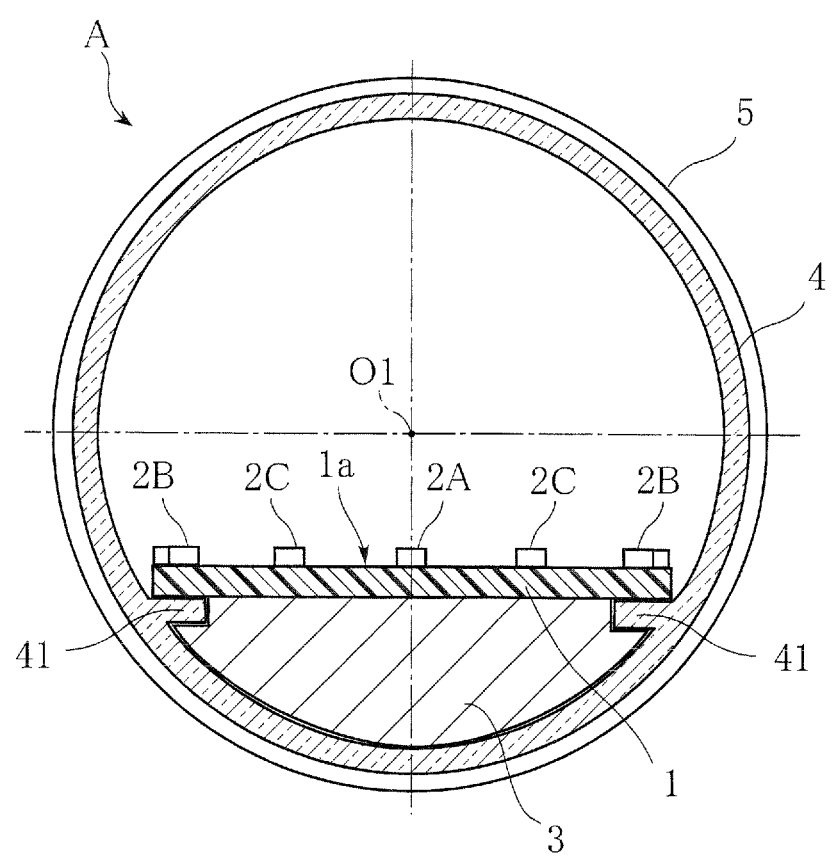
FIG. 2 is a schematic sectional view taken along liens II-II in FIG. 1.

FIGS. 1 and 2 show an example of LED lamp according to the present invention. FIG. 1 is a schematic perspective view of the LED lamp, whereas FIG. 2 is a schematic sectional view taken along lines II-II in FIG. 1.

The LED lamp A of this embodiment includes a support substrate 1, a plurality of LED modules 2, a heat dissipation member 3, a case 4 and a pair of bases 5. The LED lamp A is to be used as attached to a general-use fluorescent lighting fixture, as a substitute for e.g. a straight-tube fluorescent lamp. When the general-use fluorescent lighting fixture is attached to e.g. an indoor ceiling, the LED lamp A is usually mounted to the lighting fixture in such a manner that the main light emission direction of the LED modules 2 is oriented downward.

The support substrate 1 supports the LED modules 2. The support substrate 1 is made of e.g. glass-fiber-reinforced epoxy resin and has an elongated plate-like shape. The mount surface 1a of the support substrate 1 is formed with a wiring pattern, not shown, made of e.g. Cu for supplying power to the LED modules 2.

As shown in FIG. 1, the LED modules 2 are mounted in a matrix arrangement on the mount surface 1a. The arrangement and number of the LED modules 2 on the mount surface 1a of the support substrate 1 shown in FIG. 1 are merely an example, and the present invention is not limited to this example. In this embodiment, the LED modules 2 comprise first, second and third LED modules 2A, 2B and 2C. The first, the second and the third LED modules 2A, 2B and 2C differ from each other in luminous intensity distribution (directivity characteristics).

Figure 3:
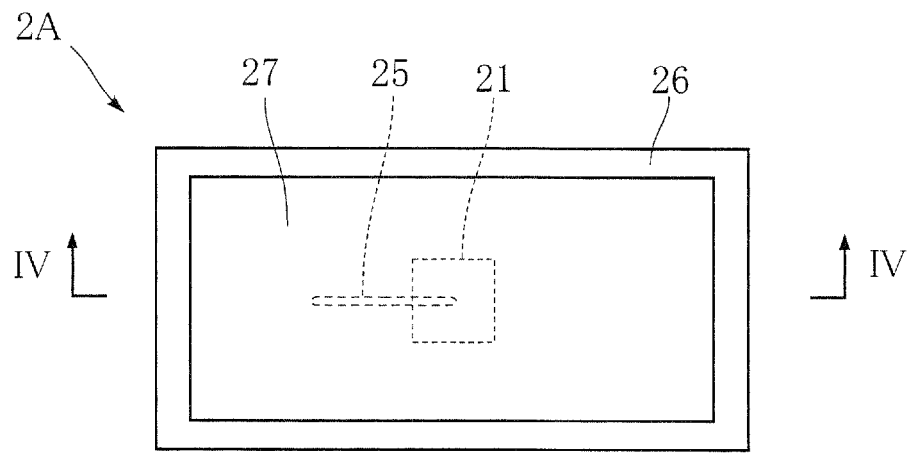
FIG. 3 is a top view of a first LED module.
Figure 4:
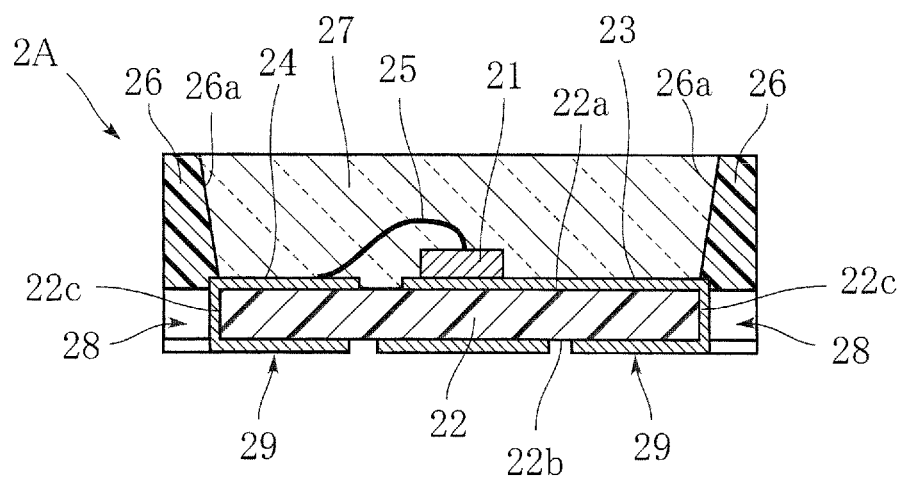
FIG. 4 is a schematic sectional view taken along lines IV-IV in FIG. 3.
Figure 5:
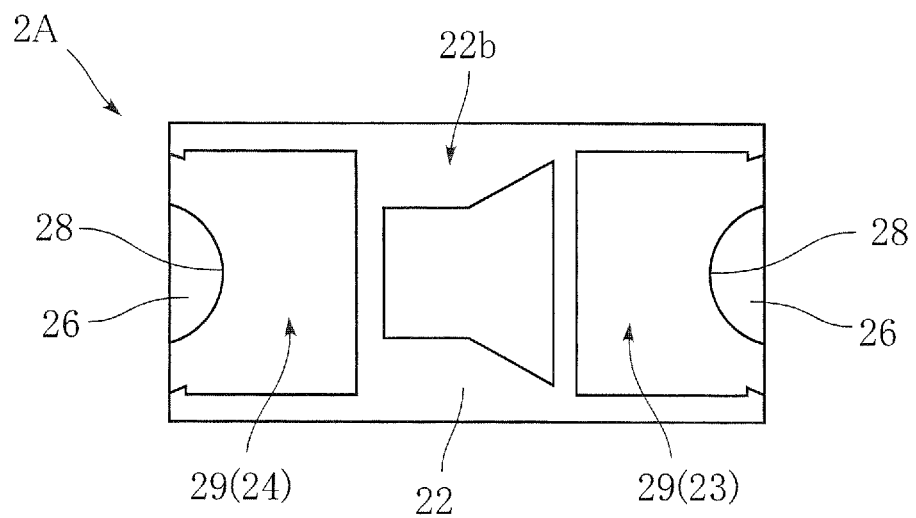
FIG. 5 is a bottom view of the first LED module.

FIGS. 3-5 show the first LED module 2A. The first LED module 2A includes an LED chip 21, a substrate 22, metal wiring patterns 23 and 24 spaced from each other, a wire 25, a frame 26 and a sealing resin 27. The first LED module 2A is about 1.6 mm in length, about 0.8 mm in width and about 0.55 mm in thickness. Thus, the thickness, which is the dimension in the direction normal to the mount surface 1a, is smaller than the length and the width, which are dimensions in the in-plane direction of the mount surface 1a.

Figure 6:
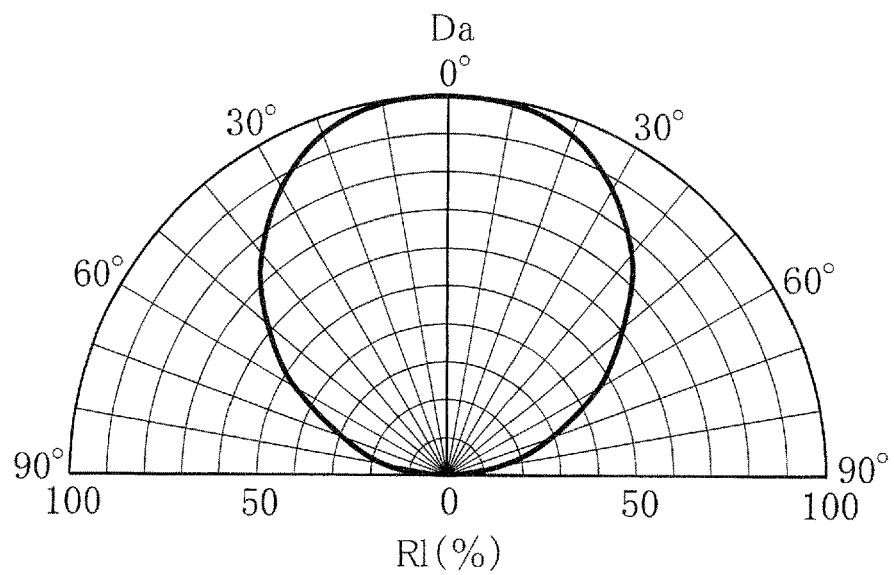
FIG. 6 shows directivity characteristics of the first LED module.

The directivity characteristics of the LED modules 2A are such that the intensity of the light emitted from the LED chip 21 is relatively high in the direction normal to the mount surface 1a of the support substrate 1. FIG. 6 shows the directivity characteristics of the first LED module 2A. In this directivity characteristics, the relative intensity RI is highest at the direction angle Da of 0°. In this embodiment, as shown in FIGS. 1 and 2, the first LED modules 2A are arranged in the longitudinal direction of the support substrate 1 at the center of the support substrate 1. Each of the first LED modules 2A is arranged in such a manner that its main light emission direction corresponds to the direction normal to the mount surface 1a.

As shown in FIG. 4, the LED chip 21 is mounted on the mount surface 22a of the substrate 22 via the wiring patterns 23 and 24. The LED chip 21 comprises lamination of e.g. an n-type semiconductor, a p-type semiconductor and an active layer sandwiched between these semiconductors (none of these are shown). The LED chip 21 emits blue light when it is made of e.g. a GaN-based semiconductor.

The LED chip 21 includes two electrodes (not shown) on the upper and the lower surfaces. By mounting the LED chip 21 on the obverse surface of the lead 23, the electrode on the lower surface of the LED chip 21 is electrically connected to the wiring pattern 23. As shown in FIGS. 4 and 5, the wiring pattern 23 reaches the reverse surface 22b of the substrate 22 through the inner surface of a recess 28 having a semicircular cross section. The wiring pattern 23 on the reverse surface 22b constitutes a mount terminal 29 to be bonded to the wiring pattern, not shown, of the support substrate 1. The electrode on the upper surface of the LED chip 21 is connected to the wiring pattern 23, 24 via the wire 25. Thus, the electrode on the upper surface of the LED chip 21 is electrically connected to the wiring pattern 23, 24. Similarly to the wiring pattern 23, the wiring pattern 23, 24 reaches the reverse surface 22b of the substrate 22 through a recess 28. The lead 24 on the reverse surface 22b constitutes a mount terminal 29 to be bonded to the wiring pattern of the support substrate 1.

The frame 26 is made of e.g. a white resin and extends upward from the periphery of the mount surface 22a. The frame 26 includes a reflective surface 26a surrounding the LED chip 21, the wire 25 and the sealing resin 27. The reflective surface 26a reflects the light emitted from the LED chip 21 to cause the light to travel upward. In this way, the first LED module 2A is designed as an LED module with a reflector. With this arrangement, in the first LED module 2A, the intensity of the light from the LED chip 21 which travels in the direction normal to the mount surface 1a of the support substrate 1 is increased.

The sealing resin 27 is provided for protecting the LED chip 21 and the wire 25. The sealing resin 27 comprises e.g. a silicone resin that transmits light emitted from the LED chip 21. In the case where a fluorescent material that emits yellow light when excited by blue light is mixed in the sealing resin 27, white light can be emitted from the LED module 2. Instead of the fluorescent material that emits yellow light, fluorescent materials each of which emits green light or red light may be mixed in.

Figure 7:
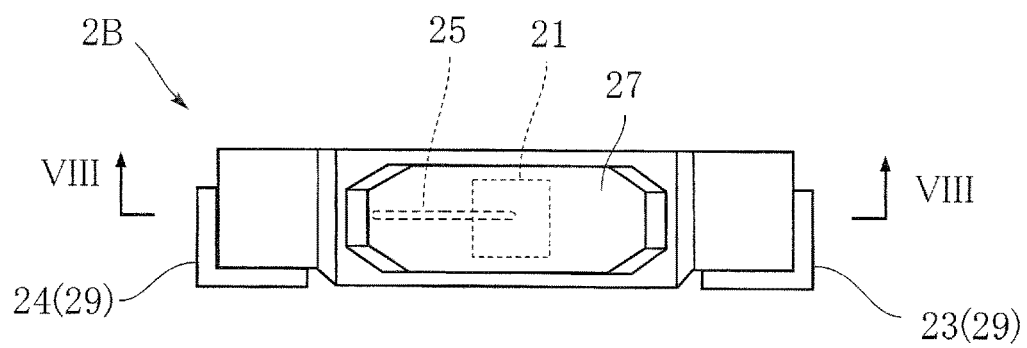
FIG. 7 is a side view of a second LED module.
Figure 8:
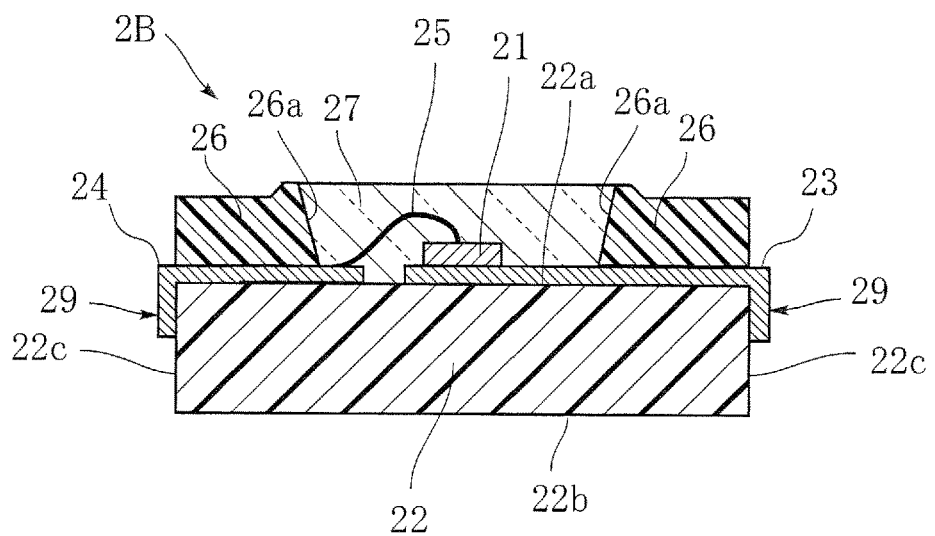
FIG. 8 is a schematic sectional view taken along lines VIII-VIII in FIG. 7.

FIGS. 7 and 8 show the second LED module 2B. In FIGS. 7 and 8, the elements that are identical or similar to those of the first LED module 2A are designated by the same reference signs as those used for the first LED module. The second LED module 2B is about 3.8 mm in length, about 1 mm in width and about 0.6 mm in thickness. Thus, the thickness, which is the dimension in the direction normal to the mount surface 1*a*, is smaller than the length and the width, which are dimensions in the in-plane direction of the mount surface 1*a*.

Figure 9:
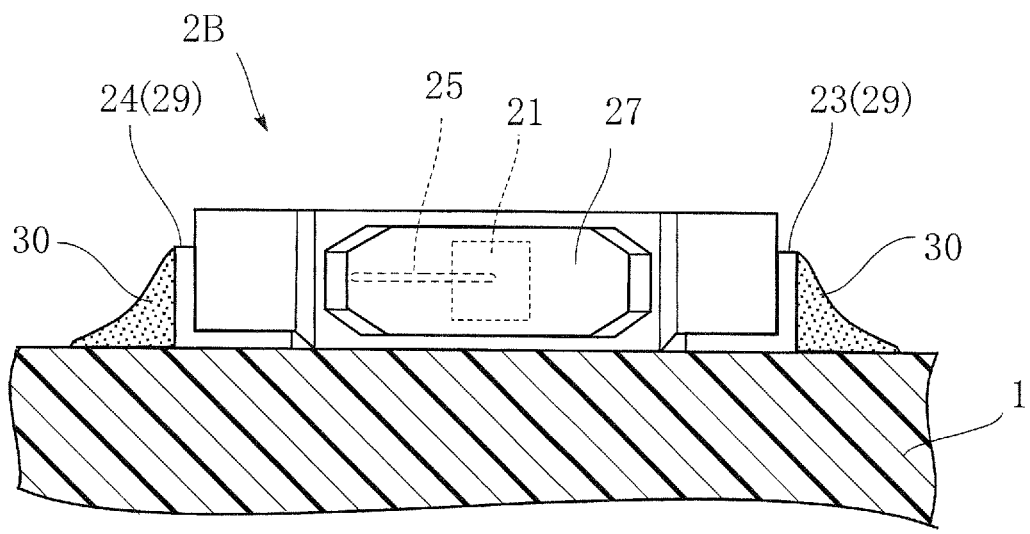
FIG. 9 shows the second LED module mounted on a support substrate.

As shown in FIG. 7, in the second LED module 2B, the leads 23, 24 extend from the mount surface 22*a* of the substrate 22 onto the side surface 22*c*. The portion of each of the leads 23 and 24 which covers the side surface 22*c* constitutes a mount terminal 29. As shown in FIG. 9, the second LED module 2B is disposed on the support substrate 1 in such a manner that the substrate 22 is oriented sideways, and fixed to the support substrate 1 by bonding the mount terminals 29 to the wiring pattern (not shown) of the support substrate 1 using solder 30. Thus, unlike the first LED module 2A, the main light emission direction of the LED chip 21 of the second LED module 2B corresponds to the in-plane direction of the mount surface 1*a* of the support substrate 1.

Figure 10:
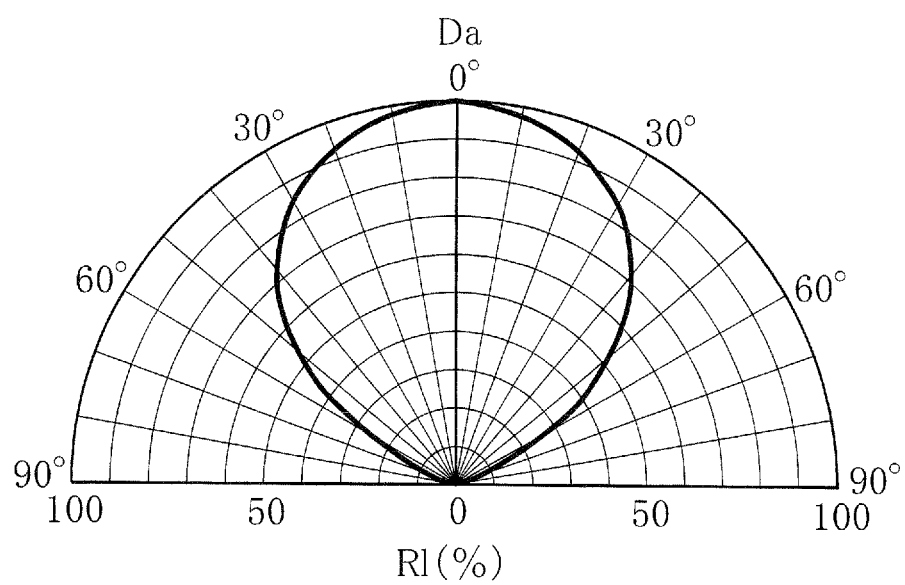
FIG. 10 shows directivity characteristics of the second LED module.

FIG. 10 shows the directivity characteristics of the second LED module 2B. In this figure, the direction corresponding to the direction angle Da of 0° is the outward direction within the plane of the mount surface 1*a* of the support substrate 1. In the second LED module 2B, the relative intensity RI is highest at the direction angle Da of 0°, i.e., in the outward direction within the plane of the mount surface 1*a*. In this embodiment, as shown in FIGS. 1 and 2, the second LED modules 2B are arranged along the edges of the support substrate 1 that are spaced in the width direction.

Figure 11:
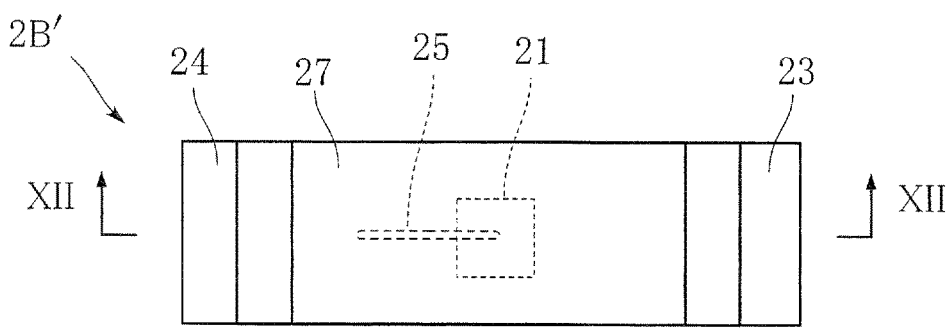
FIG. 11 is a side view showing a variation of the second LED module.
Figure 12:
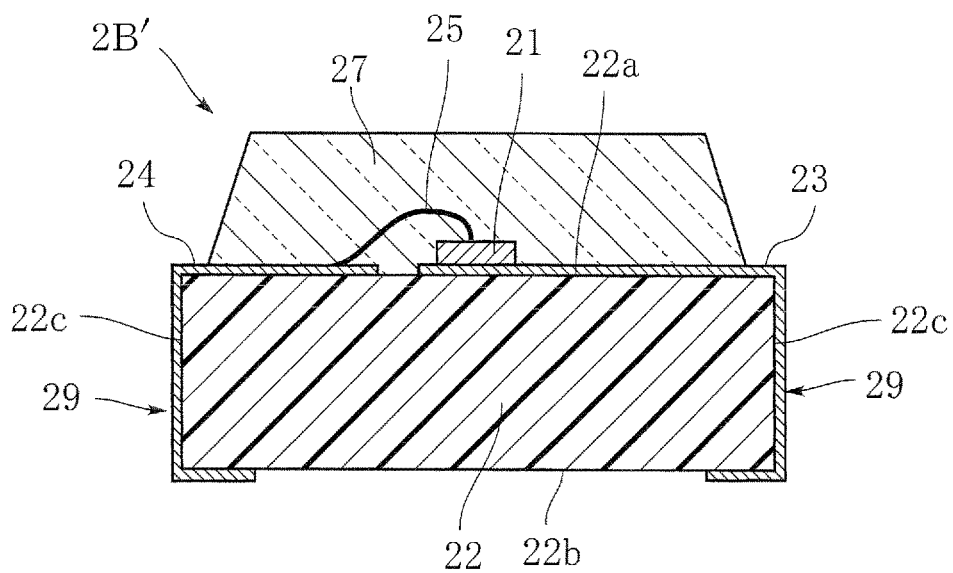
FIG. 12 is a schematic sectional view taken along lines XII-XII in FIG. 11.
Figure 13:
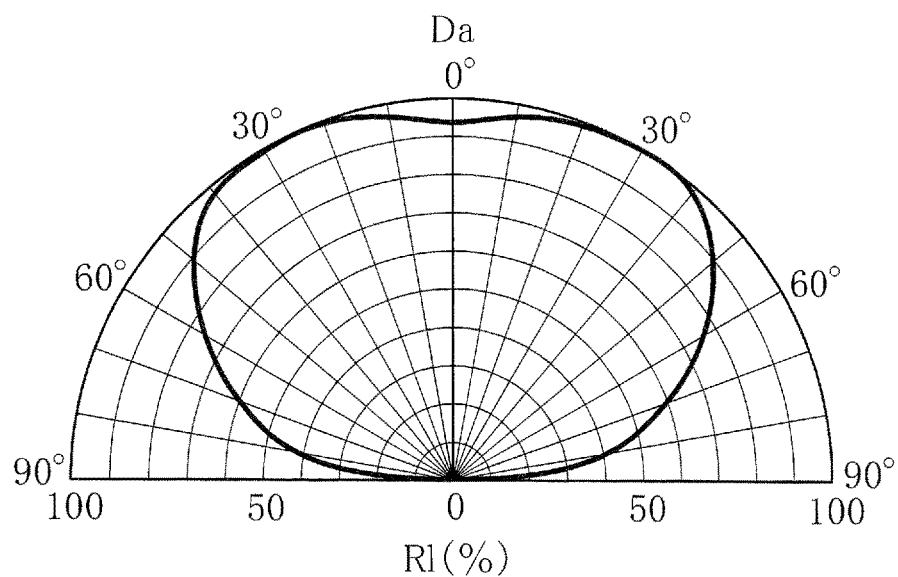
FIG. 13 shows directivity characteristics of a variation of the second LED module.

As the second LED module, the second LED module 2B' as shown in FIGS. 11 and 12 may be employed which is not provided with a frame 26 and hence does not have a reflector. In the second LED module 2B', the sealing resin 27 is substantially trapezoidal in side view. The leads 23, 24 of the second LED module 2B' extend from the mount surface 22*a* of the substrate 22 onto the reverse surface 22*b* via the side surface 22*c*. In the second LED module 2B' again, the portion of each of the leads 23 and 24 which is positioned on the side surface 22*c* constitutes amount terminal 29. FIG. 13 shows the directivity characteristics of the second LED module 2B'. As compared with the second LED module 2B, the relative intensity RI is high in a wider region in the outward direction within the plane of the mount surface 1*a*.

Figure 14:
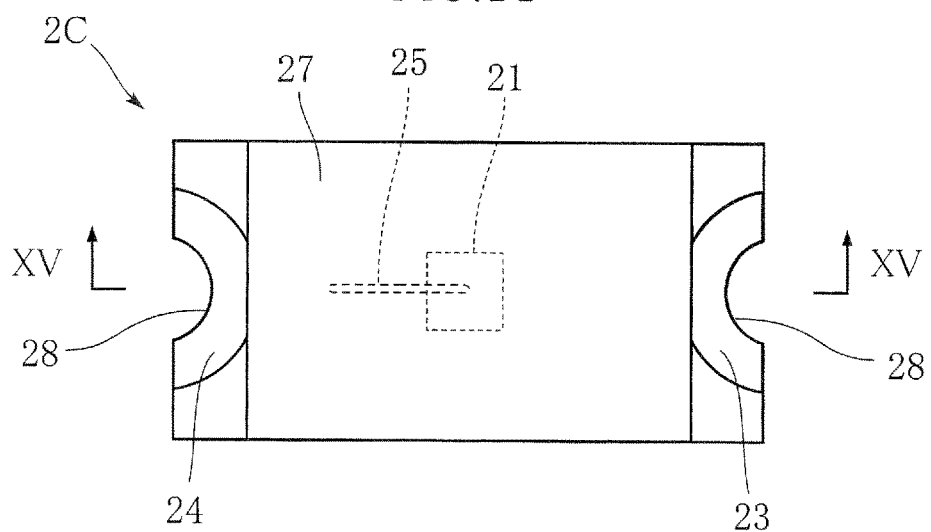
FIG. 14 is a top view of a third LED module.
Figure 15:
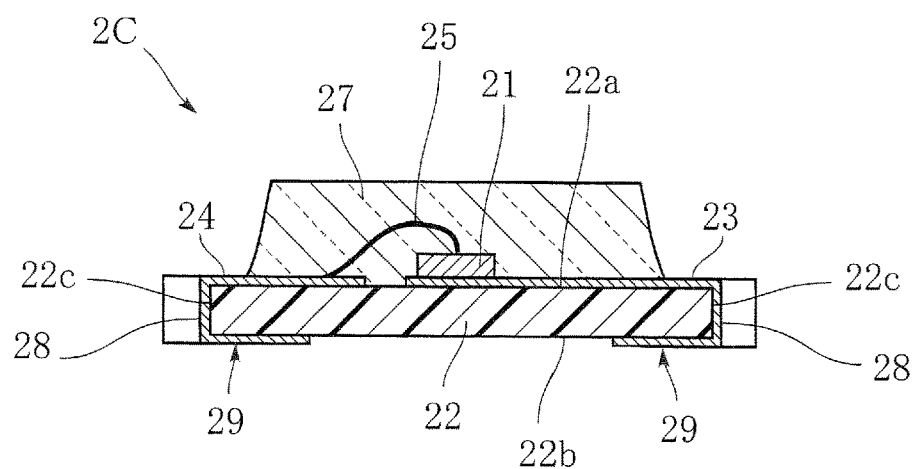
FIG. 15 is a schematic sectional view taken along lines XV-XV in FIG. 14.
Figure 16:
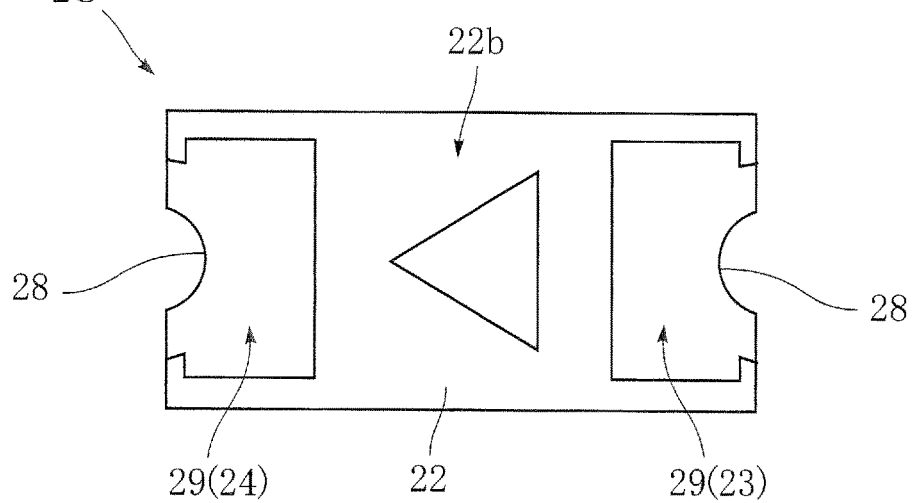
FIG. 16 is a bottom view of the third LED module.

FIGS. 14-16 show the third LED module 2C. In these figures, the elements that are identical or similar to those of the first and the second LED modules 2A, 2B are designated by the same reference signs as those used for the first and the second LED modules. The third LED module 2C is about 1.6 mm in length, about 0.8 mm in width and about 0.36 mm in thickness. Thus, the thickness, which is the dimension in the direction normal to the mount surface 1*a*, is smaller than the length and the width, which are dimensions in the in-plane direction of the mount surface 1*a*.

The third LED module 2C is different from the first and the second LED modules 2A, 2B in that the third LED module does not have a frame 26 on the substrate 22. That is, as shown in FIG. 15, in the third LED module 2C, the sealing resin 27 is substantially trapezoidal in side view and its most part is exposed. Thus, in the third LED module 2C, light from the LED chip 21 is emitted not only in the main light emission direction but also obliquely or sideways at a relatively high ratio.

Figure 17:
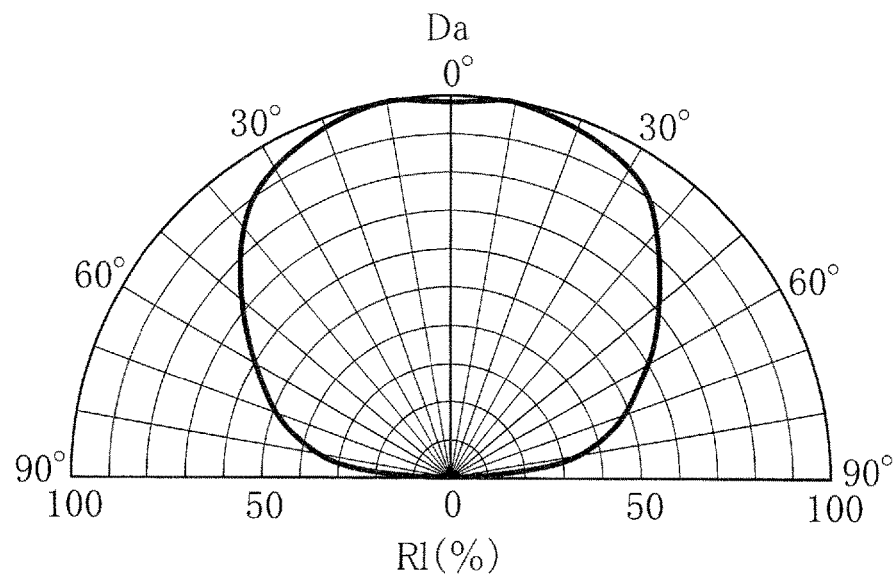
FIG. 17 shows directivity characteristics of the third LED module.

FIG. 17 shows the directivity characteristics of the third LED module 2C. In a strict sense, in this directivity characteristics, the relative intensity RI is not highest at the direction angle Da of 0°. As compared with the first LED module 2A, for example, the relative intensity RI at the direction angle Da of 0° is slightly lower, but the distribution of the relative intensity RI is more uniform. In this embodiment, as shown in FIGS. 1 and 2, the LED modules 2C are aligned on the mount surface 1*a* in each of the regions between the first LED modules 2A and the second LED modules 2B. Each of the third LED modules 2C is arranged such that the main light emission direction of the LED chip 21 corresponds to the direction perpendicular to the mount surface 1*a* of the support substrate 1.

The heat dissipation member 3 is provided for dissipating the heat generated at the LED modules 2 and attached to the reverse side of the support substrate 1, as shown in FIGS. 1 and 2. The heat dissipation member 3 is made of e.g. Al and has a thin block-like shape extending in the longitudinal direction of the support substrate 1.

The surface of the heat dissipation member 3 may be treated to provide insulation so that the heat dissipation member can directly support the LED modules 2. That is, the support substrate 1 may be dispensed with. In this case, a wiring pattern similar to the wiring pattern formed on the mount surface 1*a* of the support substrate 1 is formed between the LED modules 2 and e.g. an insulating sheet (not shown) having insulating property. With this arrangement, it is not necessary to prepare the support substrate 1 for mounting the LED modules 2, in addition to the heat dissipation member 3, so that the cost for the parts is reduced.

The case 4 is provided for accommodating the support substrate 1, the heat dissipation member 3 and so on, and is cylindrical, as shown in FIG. 2. The case 4 comprises a single-piece member made by extrusion of a synthetic resin such as polycarbonate. When part of the light emitted from the LED modules 2 reaches the inner surface of the case 4, the case 4 allows the light to pass through while diffusing the light.

A pair of projecting pieces 41 are formed integrally on the inner surface of the case 4 to project inward. In the state shown in FIG. 2, part of the heat dissipation member 3 is held in engagement with the projecting pieces 41 so that the movement of the heat dissipation member 3 relative to the case 4 in a direction perpendicular to the center axis 01 (upward direction in the figure) is restricted. The support substrate 1, the heat dissipation member 3 and so on are housed in the case 4 by inserting the heat dissipation member 3 into the case 4 by sliding movement on the inner side of the projecting pieces 41.

The paired bases 5 are to be attached to a socket (not shown) of a general-use fluorescent lighting fixture to supply AC power from a commercial power supply. As shown in FIG. 1, each of the bases 5 is provided with two terminals 51. The terminals 51 are the portions to be fitted into the insertion ports of the socket of the general-use fluorescent lighting fixture.

Figure 18:
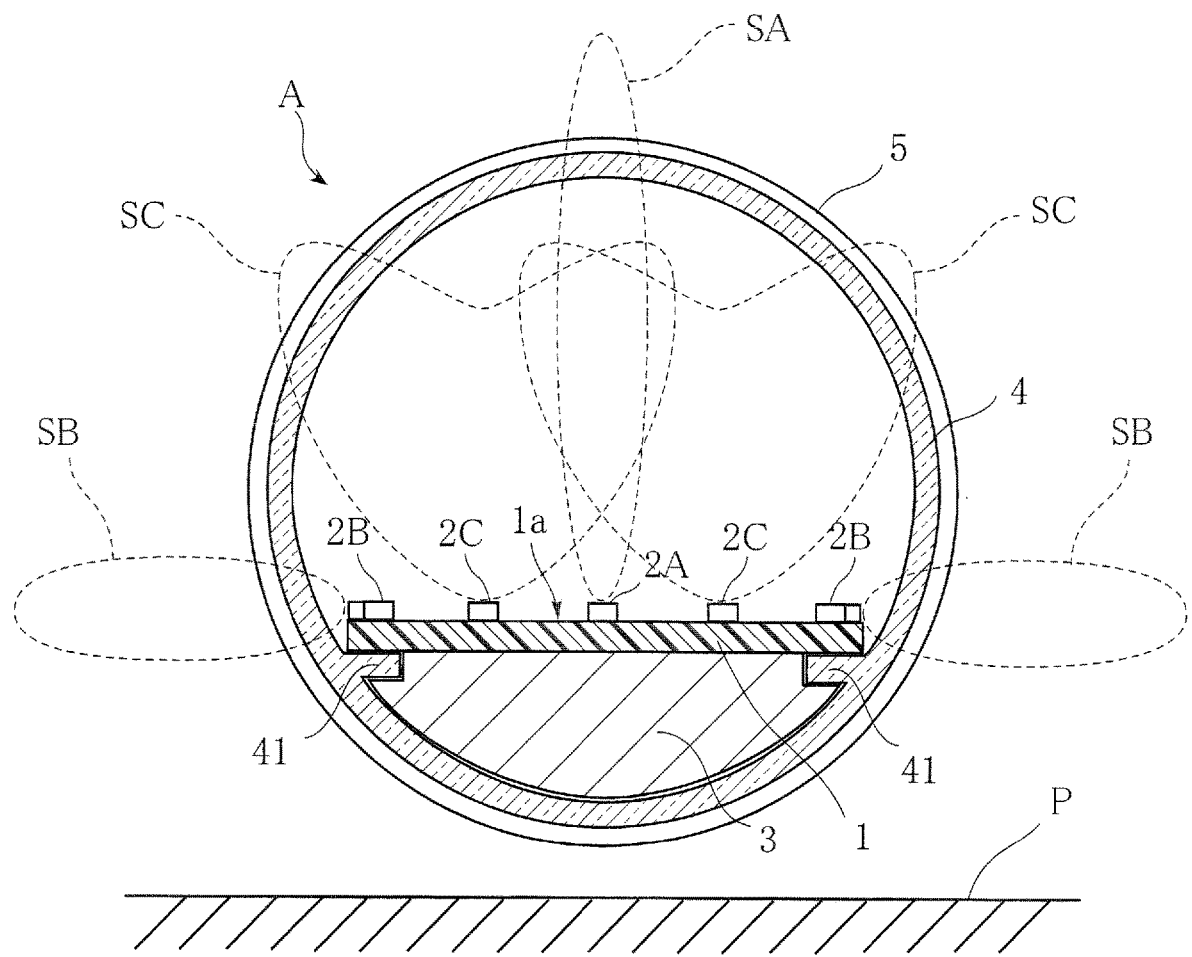
FIG. 18 is a view for explaining advantages of the LED lamp.

The advantages of the LED lamp A are described below with reference to FIG. 18. FIG. 18 shows the cross section of the LED lamp A attached to a general-use fluorescent lighting fixture fixed to e.g. an indoor ceiling P. It is to be noted that the illustration of FIG. 18 is upside down.

According to this embodiment, when the LED lamp A is turned on, light is emitted from the LED chips 21 of the first through the third LED modules 2A, 2B and 2C. The dotted line SA shows the directivity characteristics of the first LED modules 2A. The directivity characteristics of the first LED modules 2A are such that the intensity of light is extremely high in the direction normal to the mount surface 1*a*. The dotted lines SB show the directivity characteristics of the second LED modules 2B. The directivity characteristics of the second LED modules 2B are such that the intensity of light is high in the outward direction within the plane of the mount surface 1a. The dotted lines SC show the directivity characteristics of the third LED modules 2C. The directivity characteristics of the third LED modules 2C are such that the intensity of light is relatively uniform around a line normal to the mount surface 1a.

In this way, since the first through the third LED modules 2A, 2B and 2C that are different from each other in light directivity characteristics are disposed on the support substrate 1 in the present embodiment, the light emitted from the LED lamp A is directed substantially uniformly in almost all directions except the direction toward the ceiling P. Thus, sufficient brightness is obtained at every point around the LED lamp A.

The LED lamp according to the present invention is not limited to the foregoing embodiment. The specific structure of each part of the LED lamp according to the present invention may be changed in design in many ways. For instance, the shapes of the support substrate 1, the LED modules 2, the heat dissipation member 3 and the case 4 and so on are not limited to those described above. The manner of mounting the LED modules 2 on the support substrate 1 (e.g. the way of alignment, number and arrangement of the LED modules 2) is not limited to the foregoing embodiment.

Figure 19:
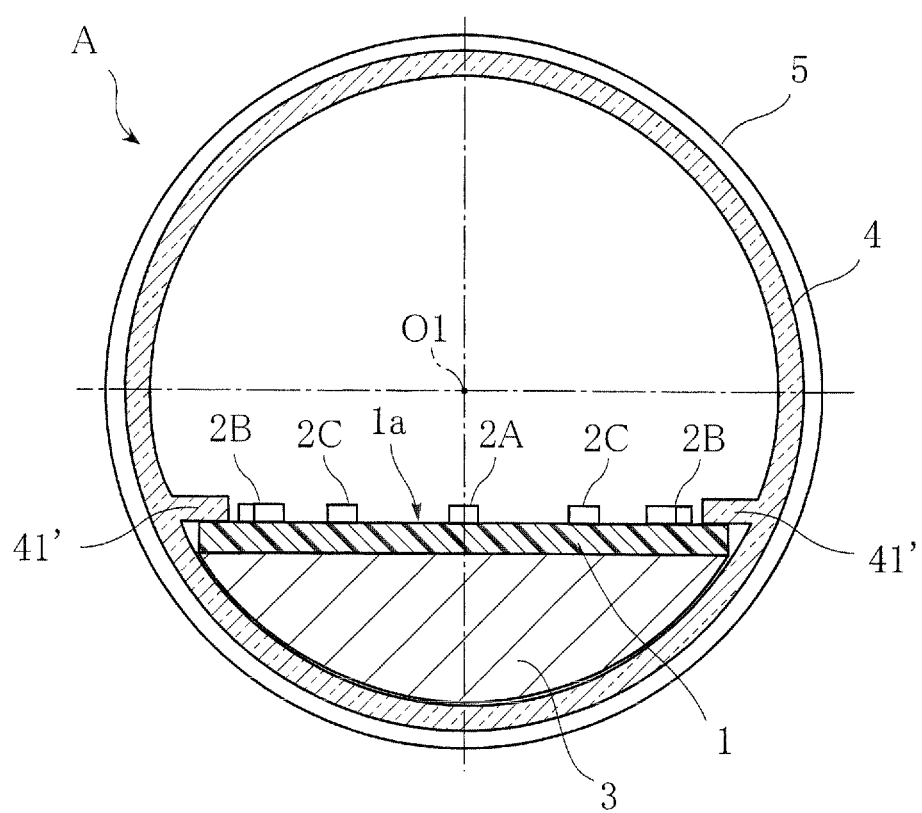
FIG. 19 shows a variation of the LED lamp.
Figure 20:
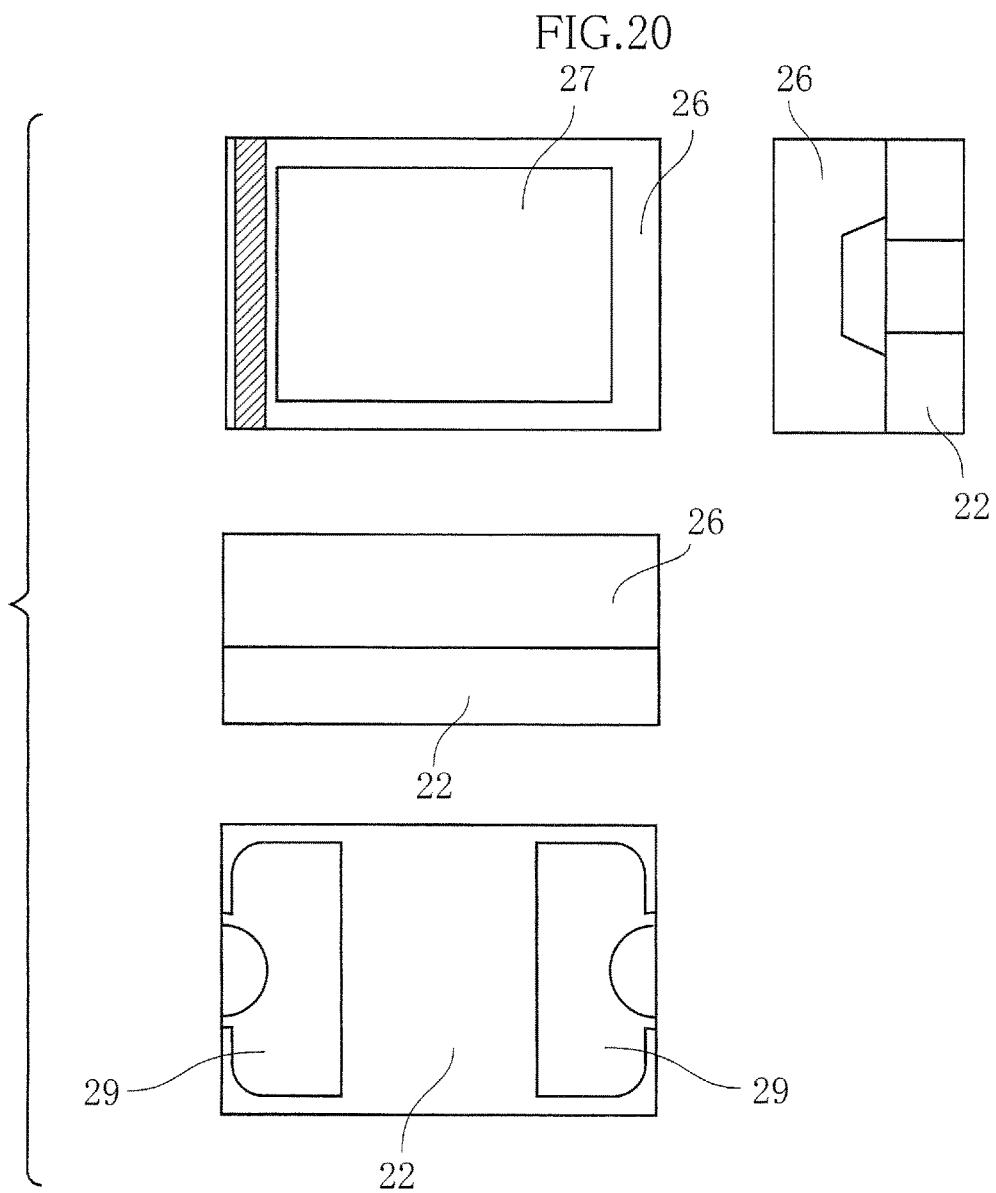
FIG. 20 is a schematic view showing the outer configuration of a variation of the first LED module.
Figure 21:
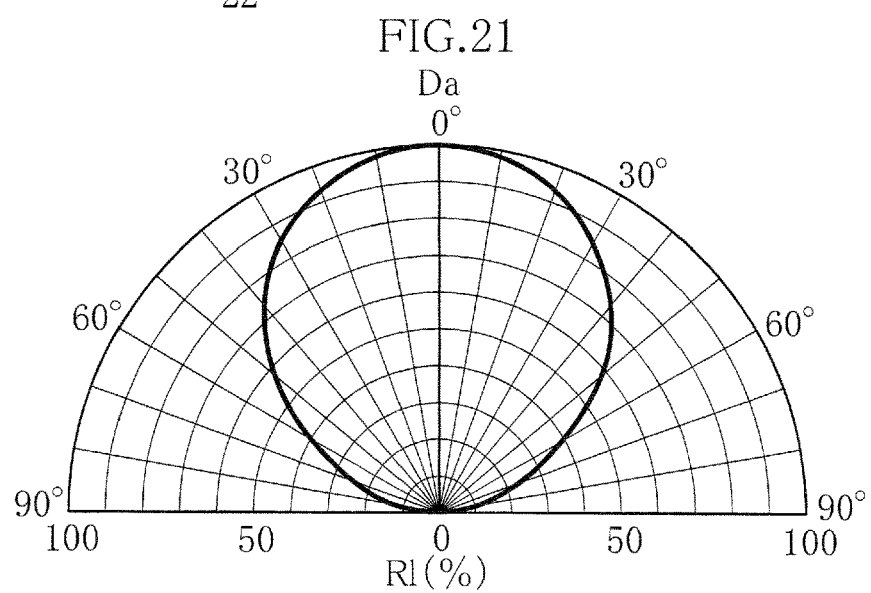
FIG. 21 shows directivity characteristics of the first LED module shown in FIG. 20.
Figure 22:
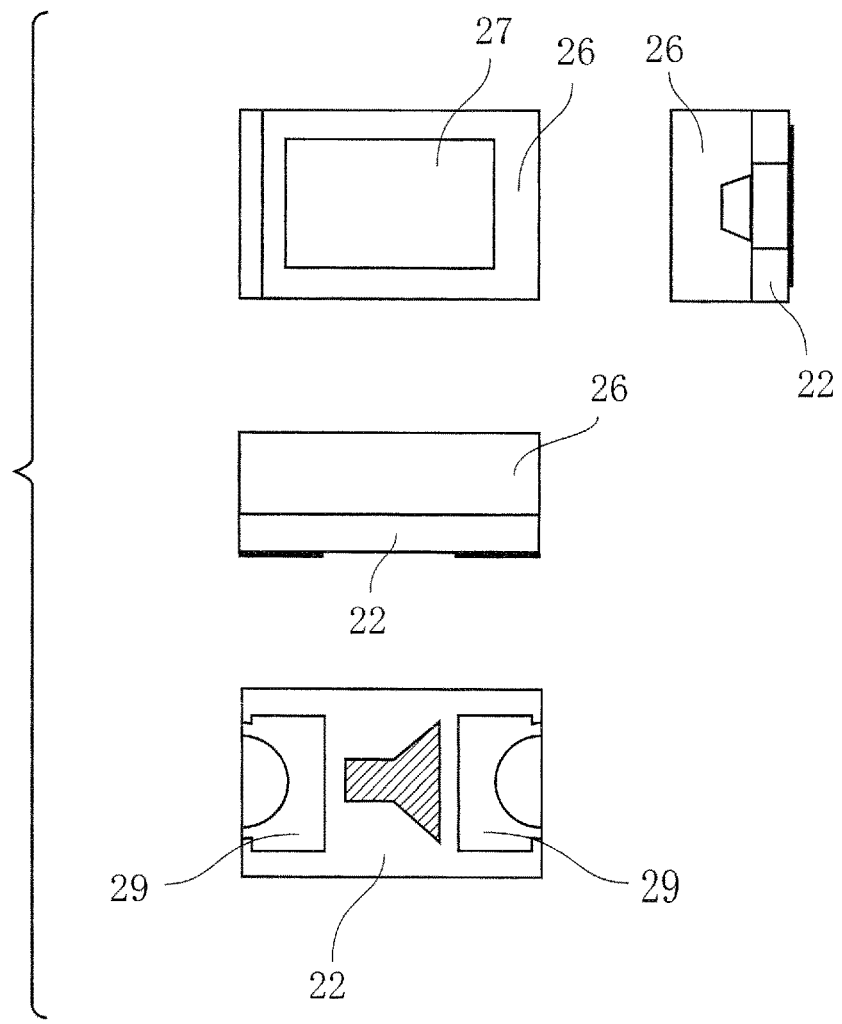
FIG. 22 is a schematic view showing the outer configuration of a variation of the first LED module.
Figure 23:
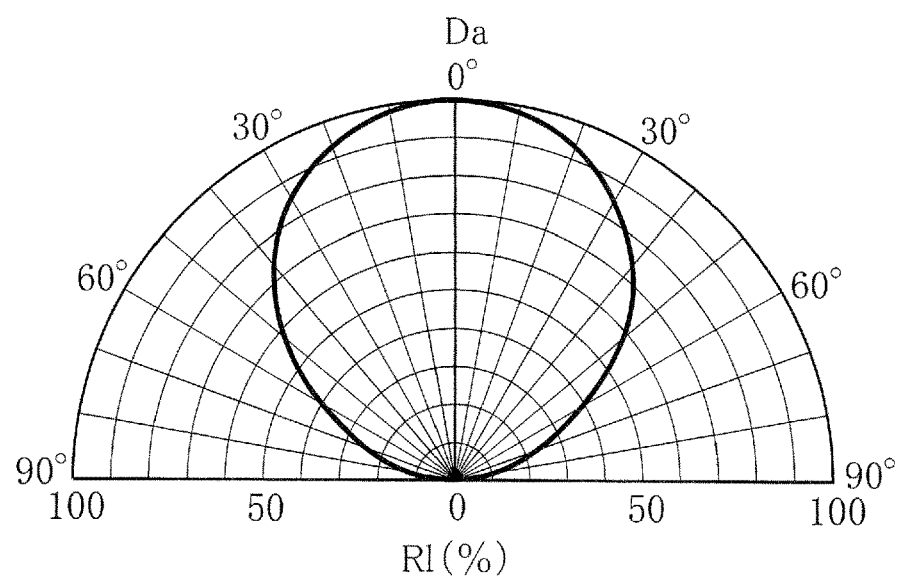
FIG. 23 shows directivity characteristics of the first LED module shown in FIG. 22.

In the foregoing embodiment, the movement of the heat dissipation member 3 is restricted by the paired projecting pieces 41 projecting from the inner side of the case 4 (see FIG. 2). Instead of this arrangement, a pair of projecting pieces 41' as shown in FIG. 19 may be employed to restrict the movement of the heat dissipation member 3 and the support substrate 1.

In the foregoing embodiment, the arrangement of the LED modules is adapted to an LED lamp used as a substitute for a straight-tube fluorescent lamp. However, the present invention is not limited to this, and the arrangement of the LED modules may be adapted to an LED lamp used as a substitute for a circular fluorescent lamp or a downlight used as embedded in an indoor ceiling.

Figure 24:
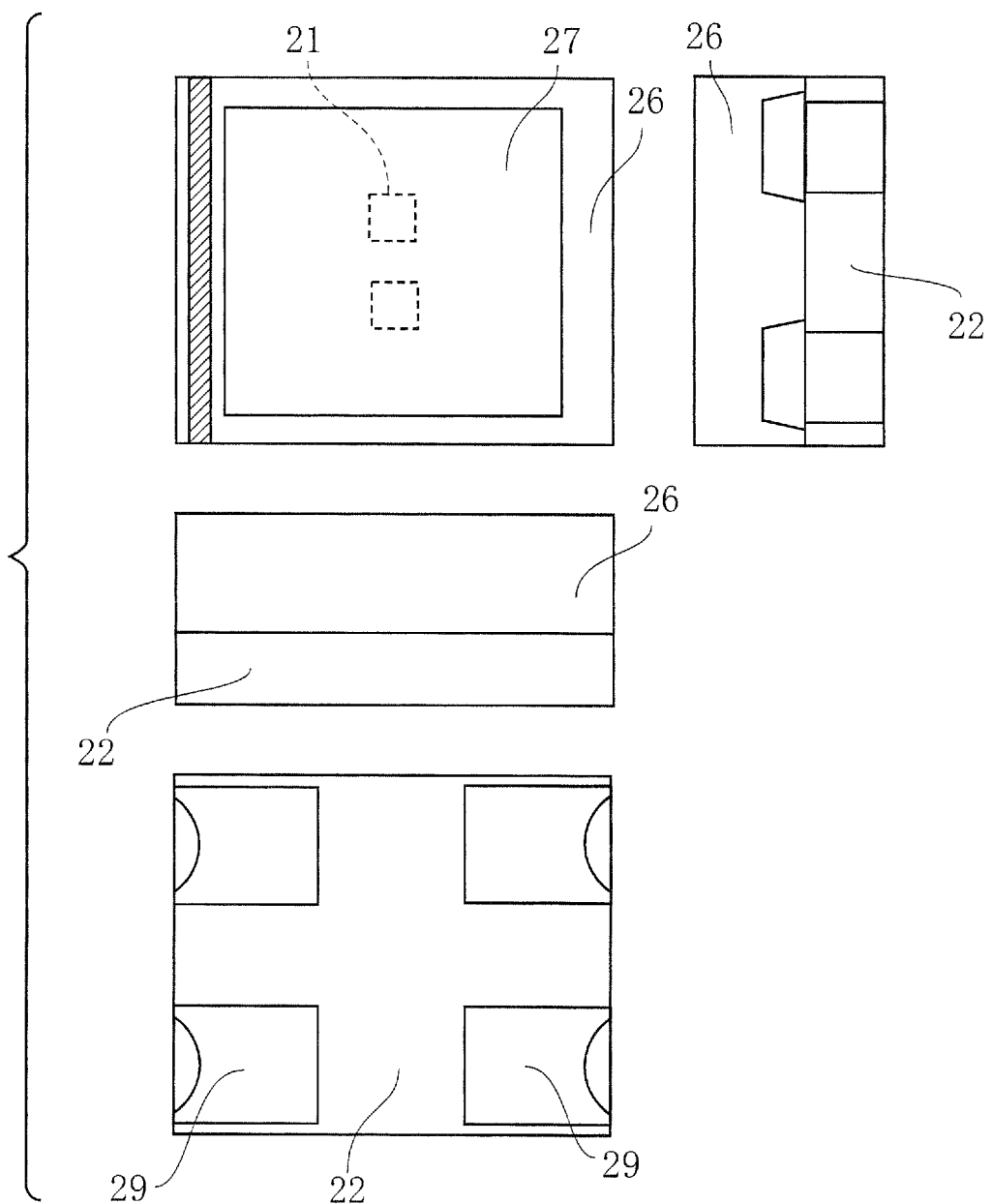
FIG. 24 is a schematic view showing the outer configuration of a variation of the first LED module.
Figure 25:
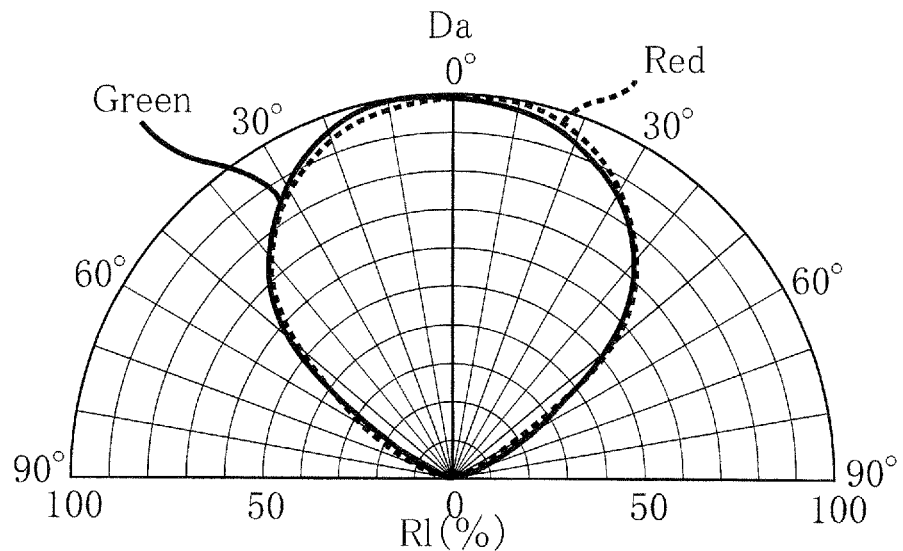
FIG. 25 shows directivity characteristics of the first LED module shown in FIG. 24, designed to emit red light and green light.
Figure 26:
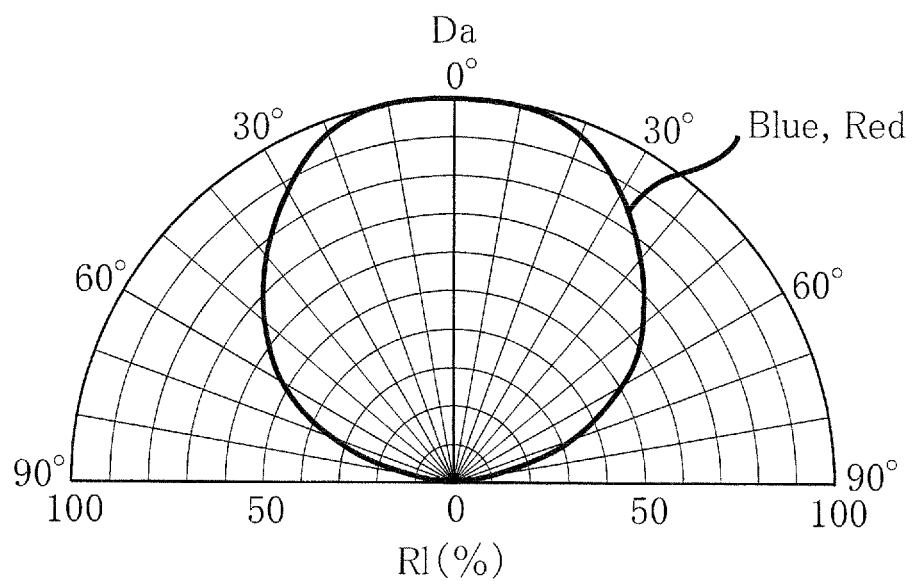
FIG. 26 shows directivity characteristics of the first LED module shown in FIG. 24, designed to emit blue light and red light.
Figure 27:
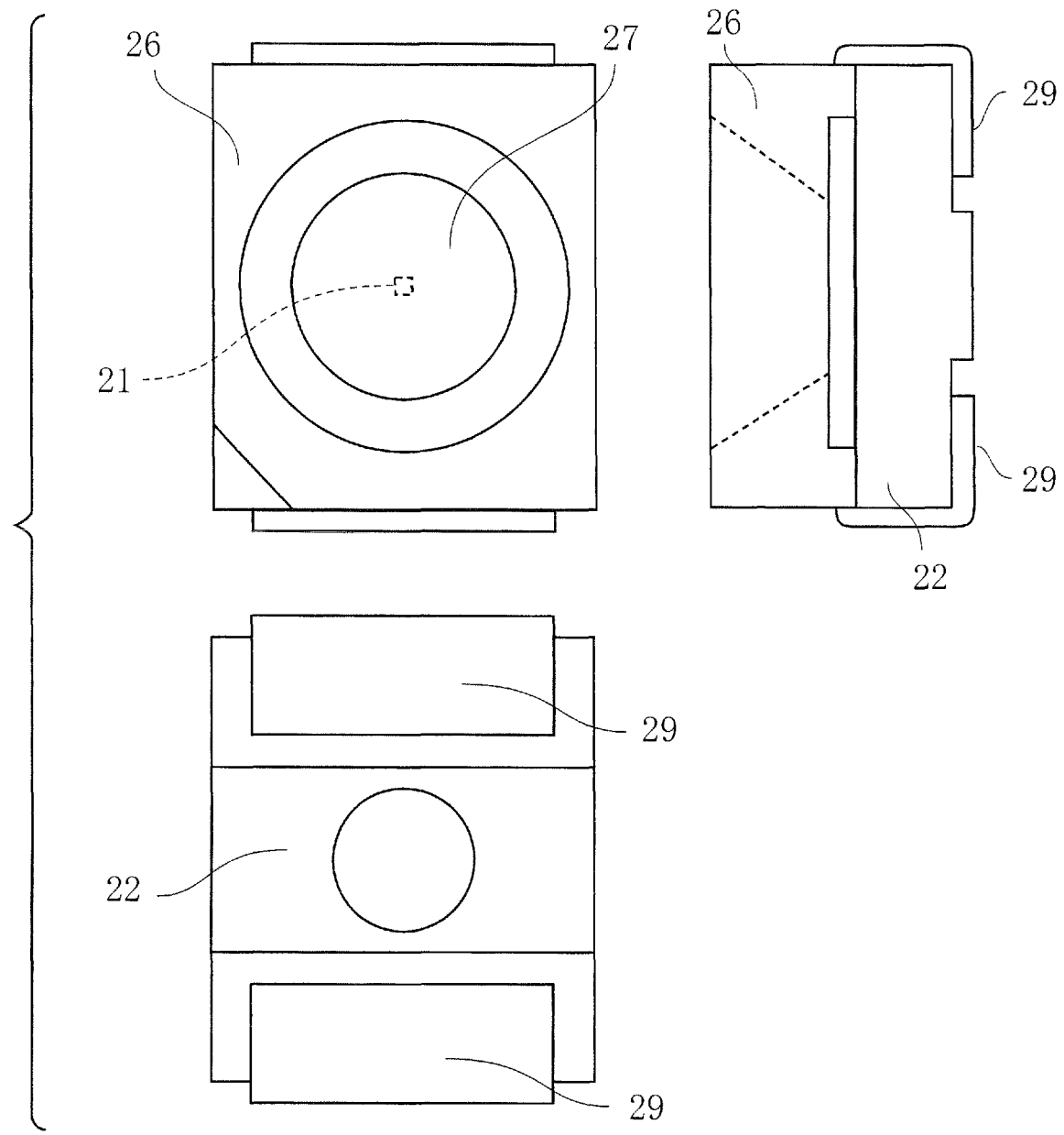
FIG. 27 is a schematic view showing the outer configuration of a variation of the first LED module.
Figure 28:
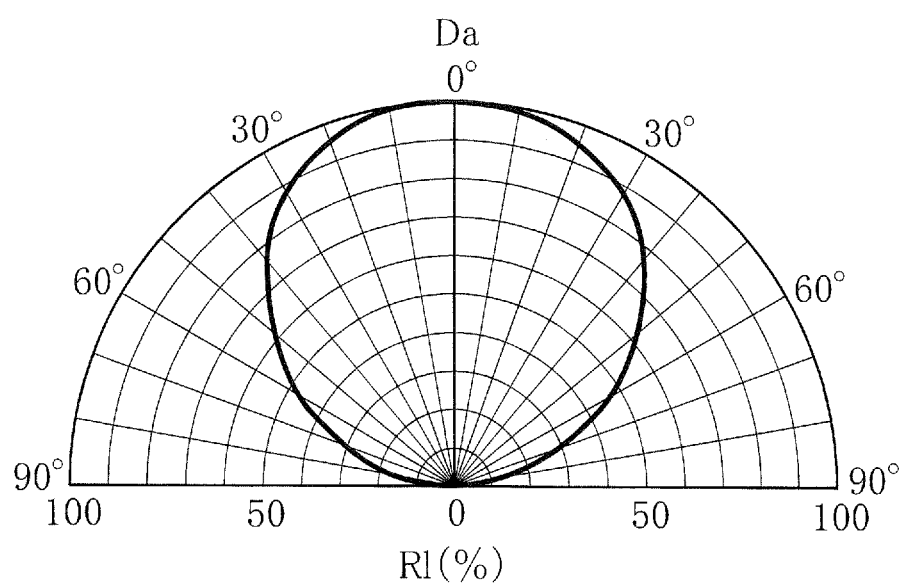
FIG. 28 shows directivity characteristics of the first LED module shown in FIG. 27.
Figure 29:
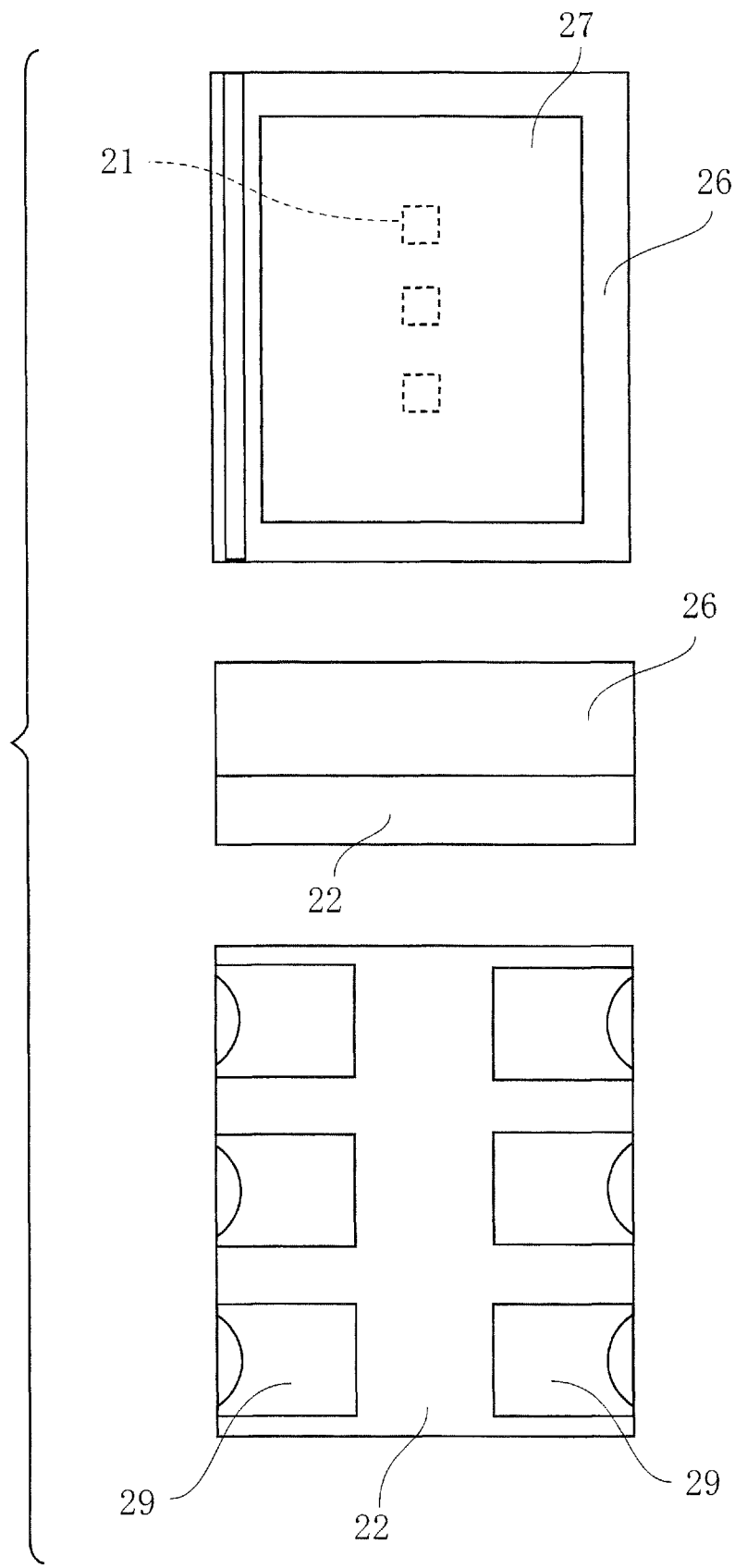
FIG. 29 is a schematic view showing the outer configuration of a variation of the first LED module.
Figure 30:
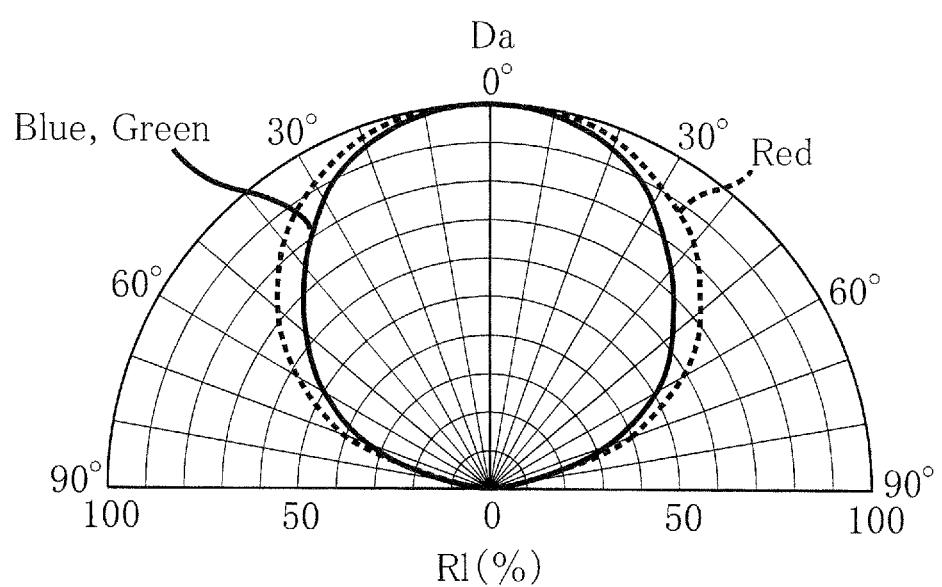
FIG. 30 shows directivity characteristics of the first LED module shown in FIG. 29.
Figure 31:
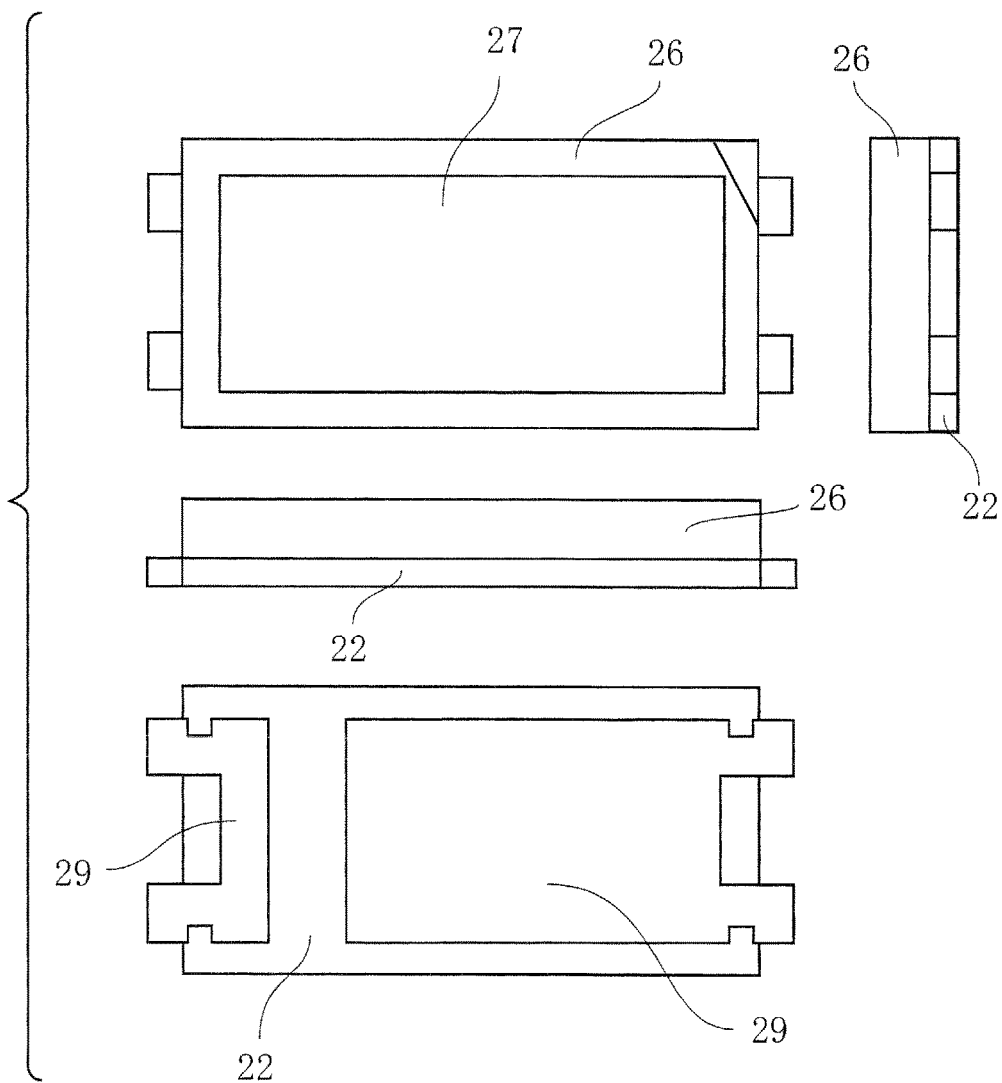
FIG. 31 is a schematic view showing the outer configuration of a variation of the first LED module.
Figure 32:
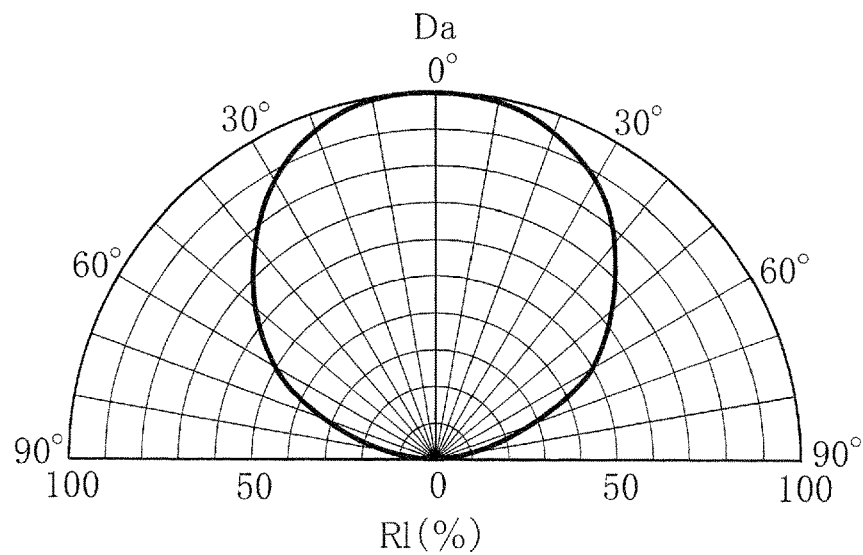
FIG. 32 shows directivity characteristics of the first LED module shown in FIG. 31.
Figure 33:
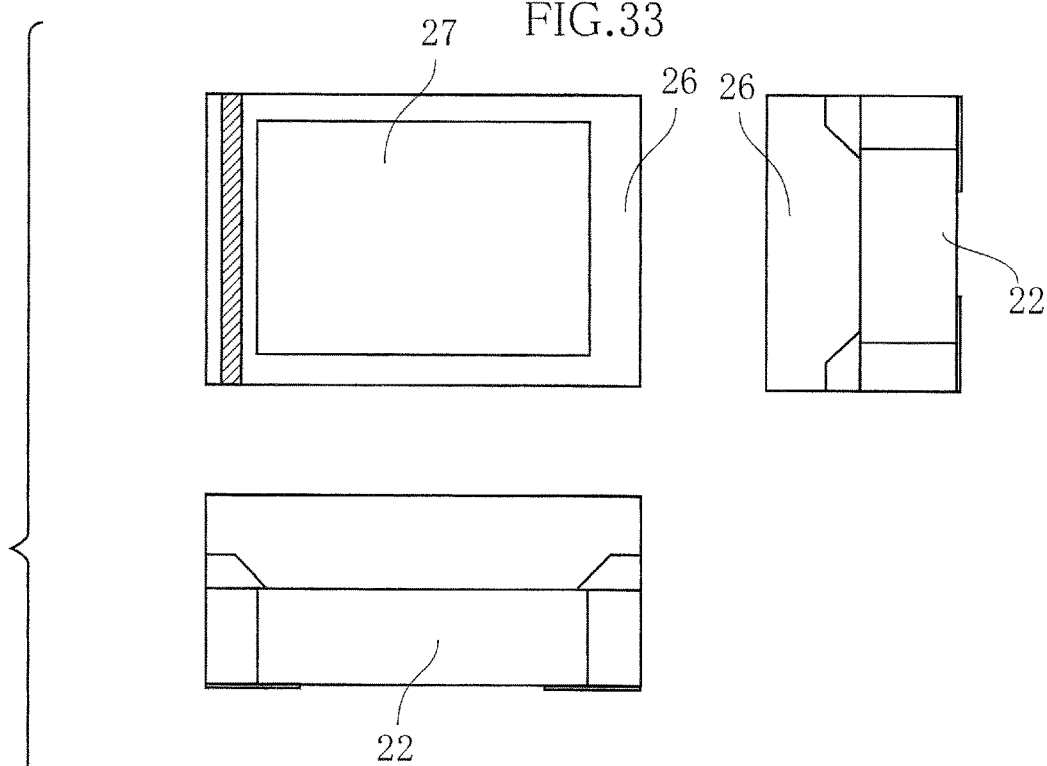
FIG. 33 is a schematic view showing the outer configuration of a variation of the second LED module.
Figure 34:
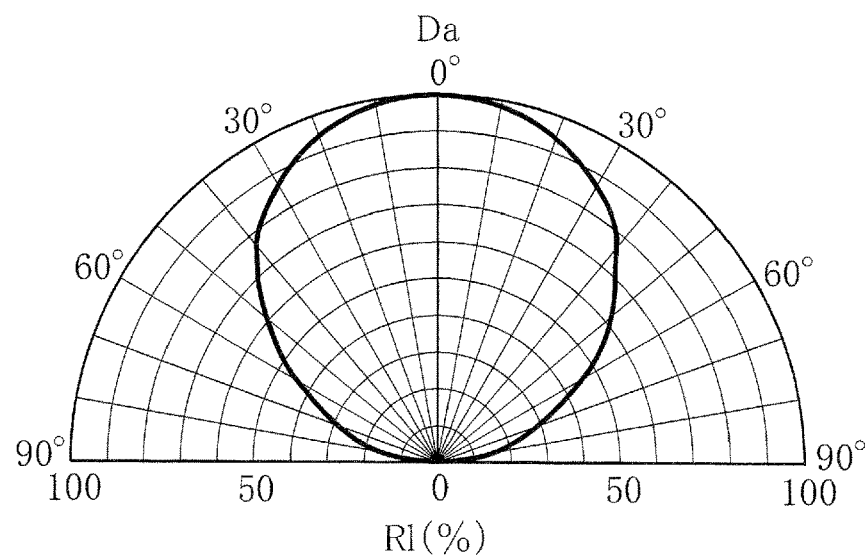
FIG. 34 shows directivity characteristics of the second LED module shown in FIG. 33.
Figure 35:
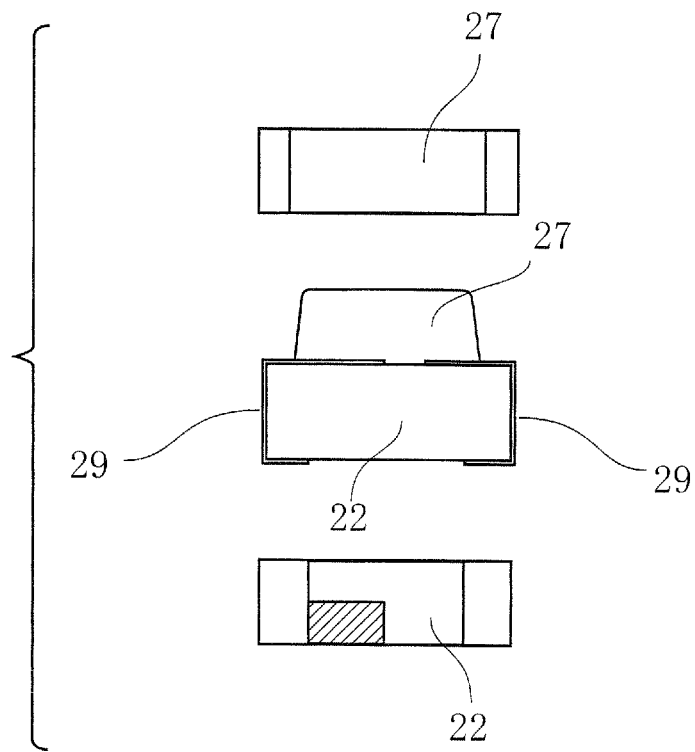
FIG. 35 is a schematic view showing the outer configuration of a variation of the second LED module.
Figure 36:
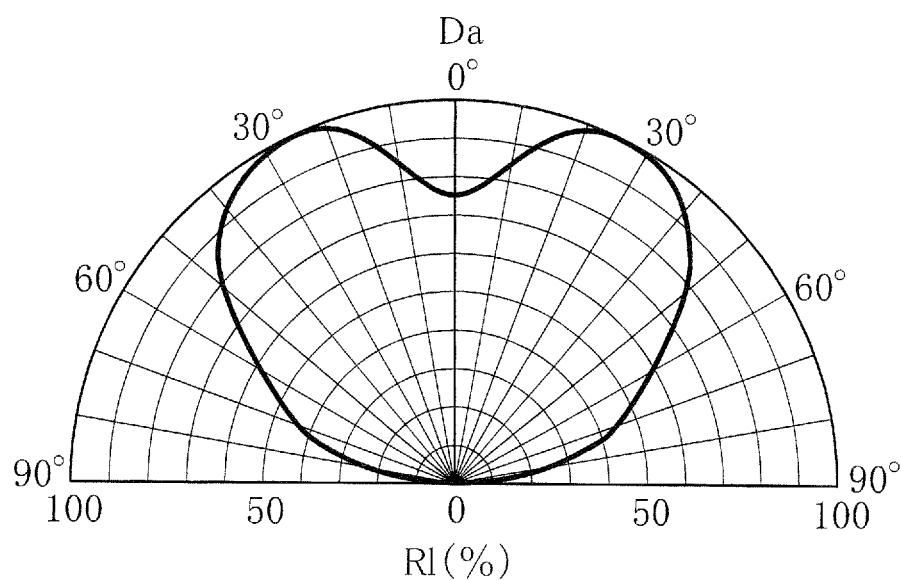
FIG. 36 shows directivity characteristics of the second LED module shown in FIG. 35.
Figure 37:
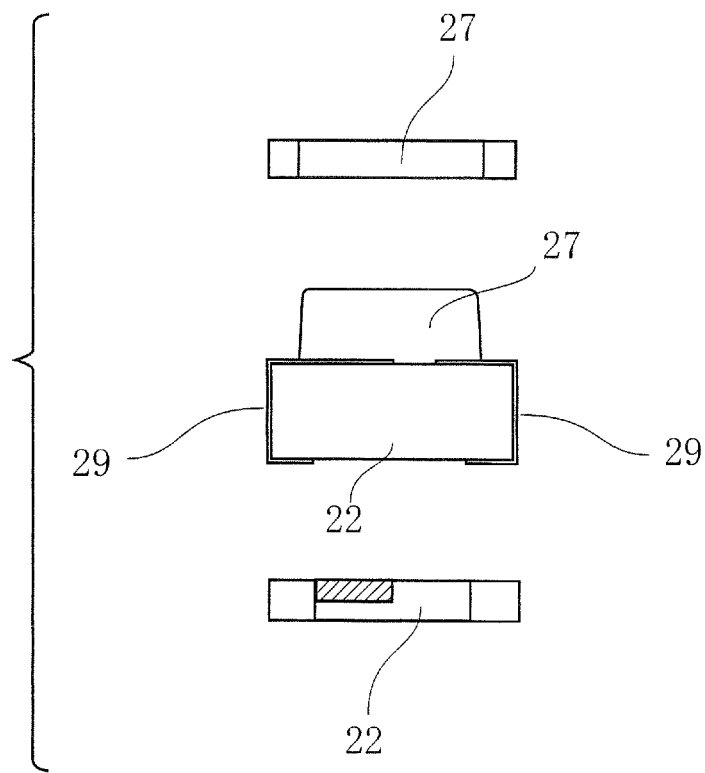
FIG. 37 is a schematic view showing the outer configuration of a variation of the second LED module.
Figure 38:
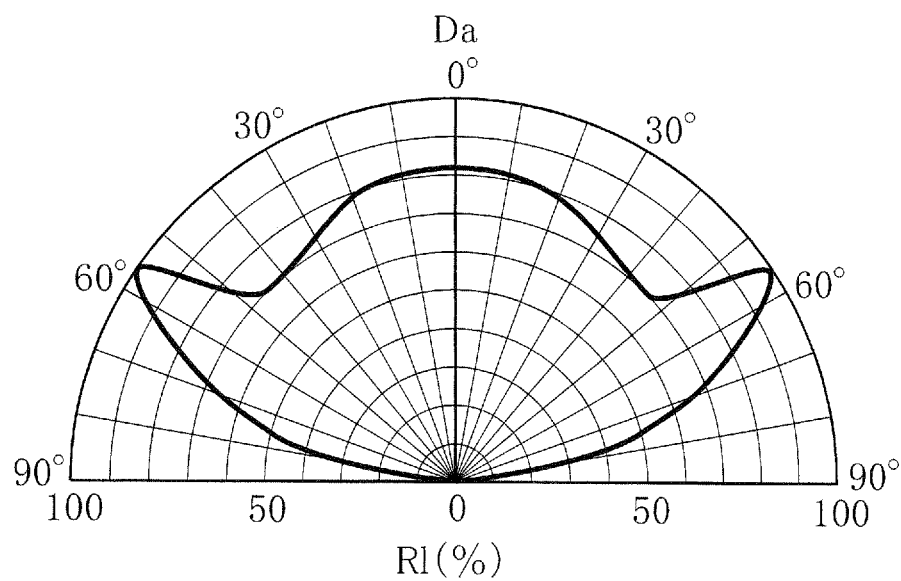
FIG. 38 shows directivity characteristics of the second LED module shown in FIG. 37.
Figure 39:
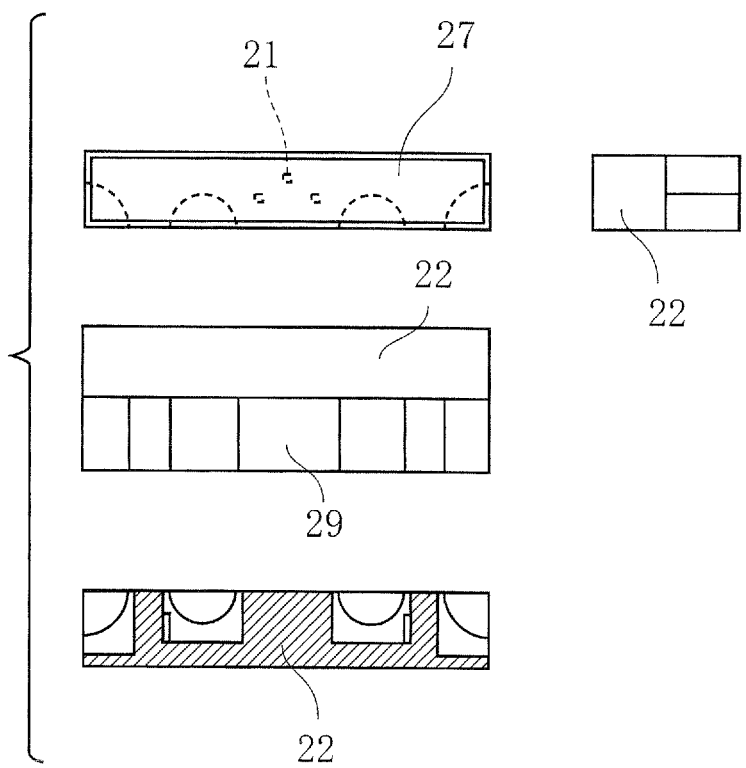
FIG. 39 is a schematic view showing the outer configuration of a variation of the second LED module.
Figure 40:
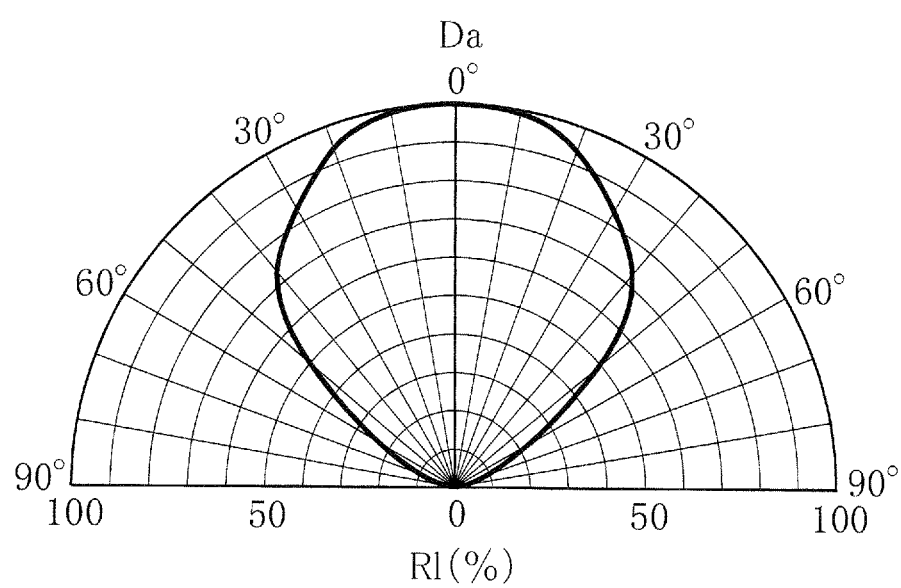
FIG. 40 shows directivity characteristics of the second LED module shown in FIG. 39.
Figure 41:
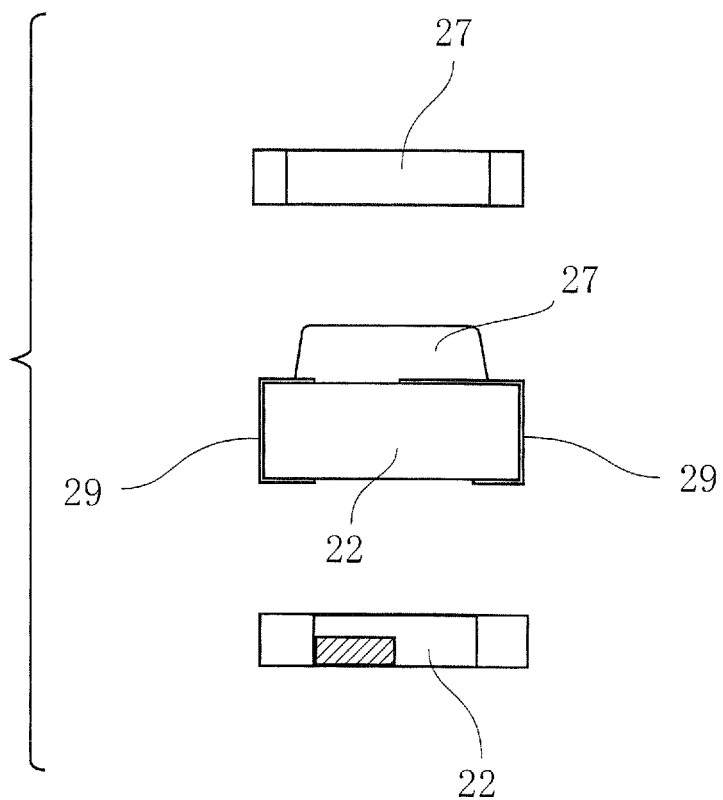
FIG. 41 is a schematic view showing the outer configuration of a variation of the second LED module.
Figure 42:
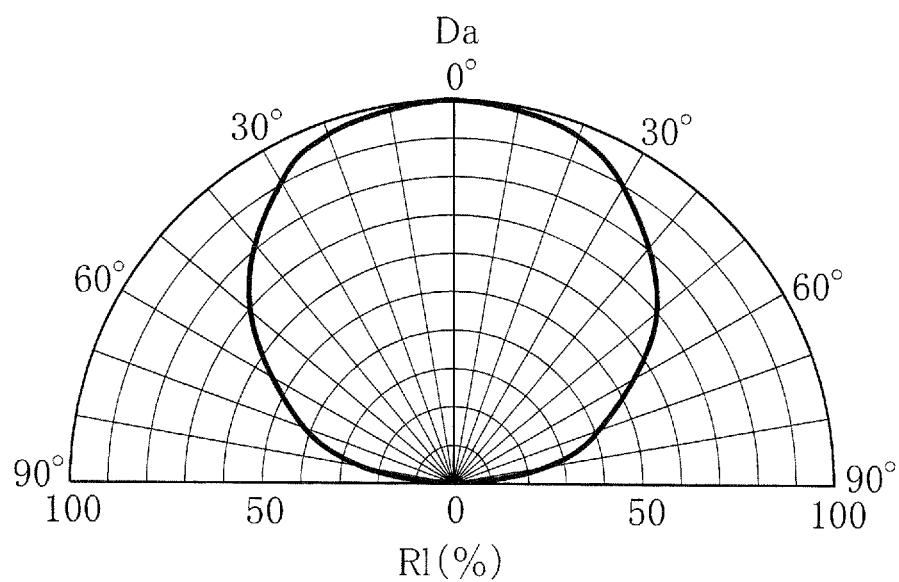
FIG. 42 shows directivity characteristics of the second LED module shown in FIG. 41.
Figure 43:
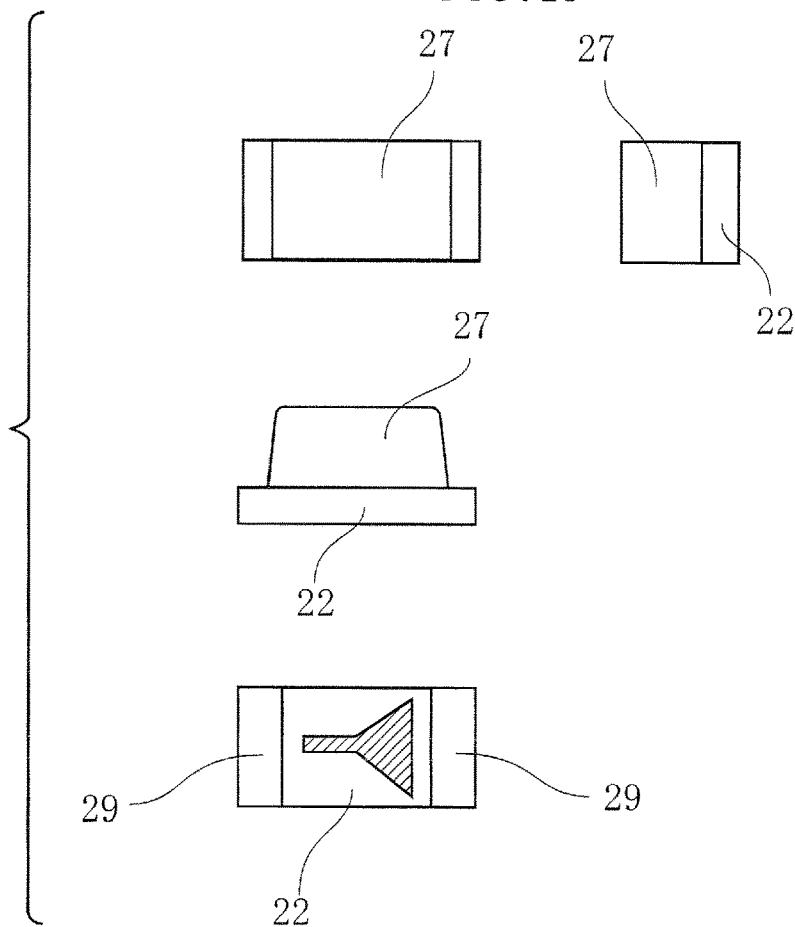
FIG. 43 is a schematic view showing the outer configuration of a variation of the third LED module.
Figure 44:
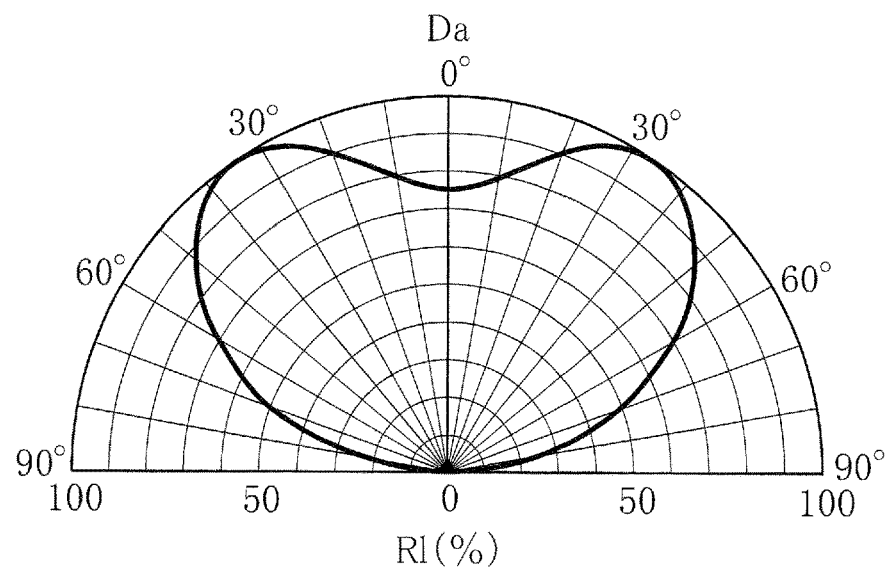
FIG. 44 shows directivity characteristics of the third LED module shown in FIG. 43.
Figure 45:
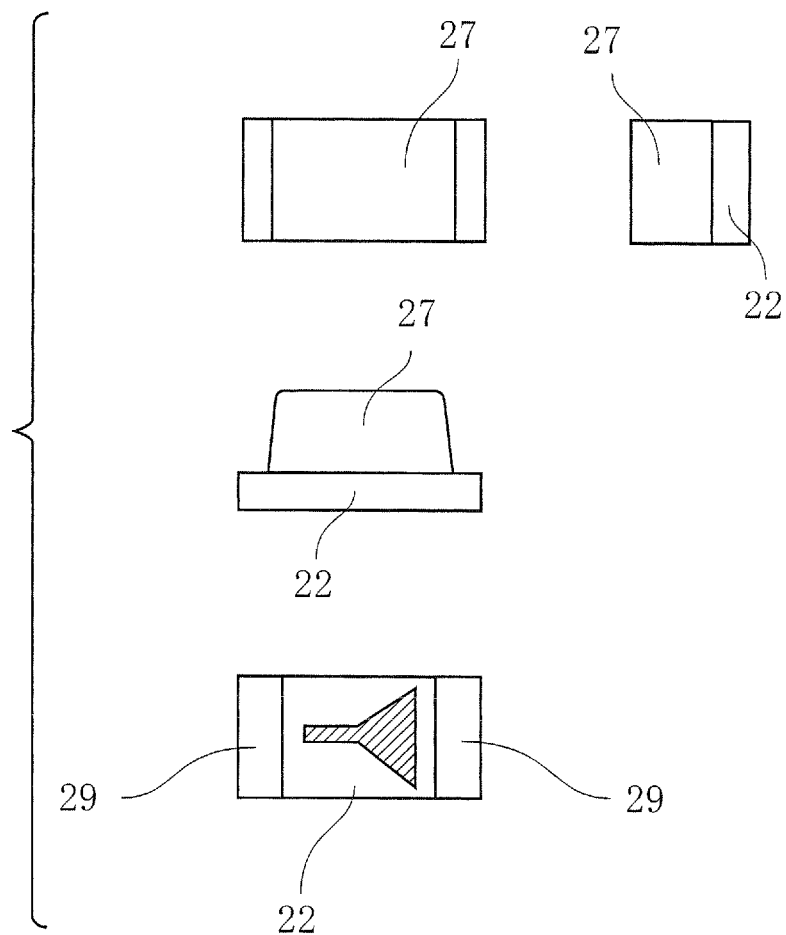
FIG. 45 is a schematic view showing the outer configuration of a variation of the third LED module.
Figure 46:
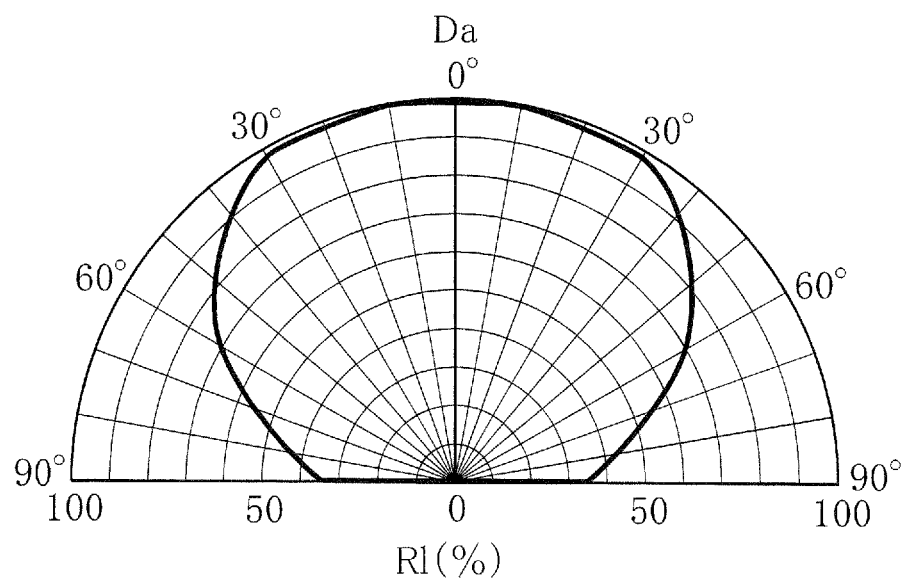
FIG. 46 shows directivity characteristics of the third LED module shown in FIG. 45.
Figure 47:
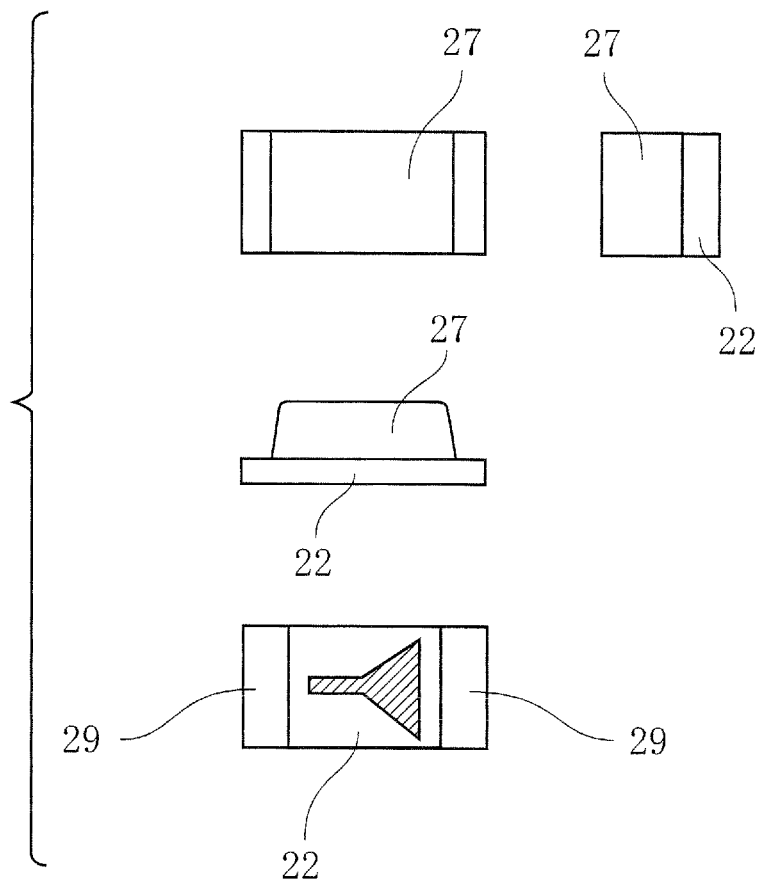
FIG. 47 is a schematic view showing the outer configuration of a variation of the third LED module.
Figure 48:
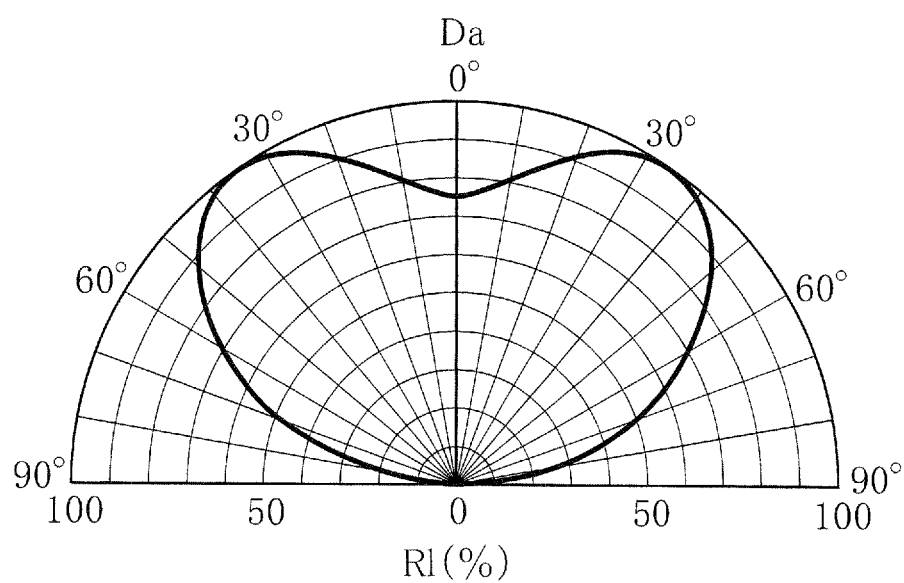
FIG. 48 shows directivity characteristics of the third LED module shown in FIG. 47.
Figure 49:
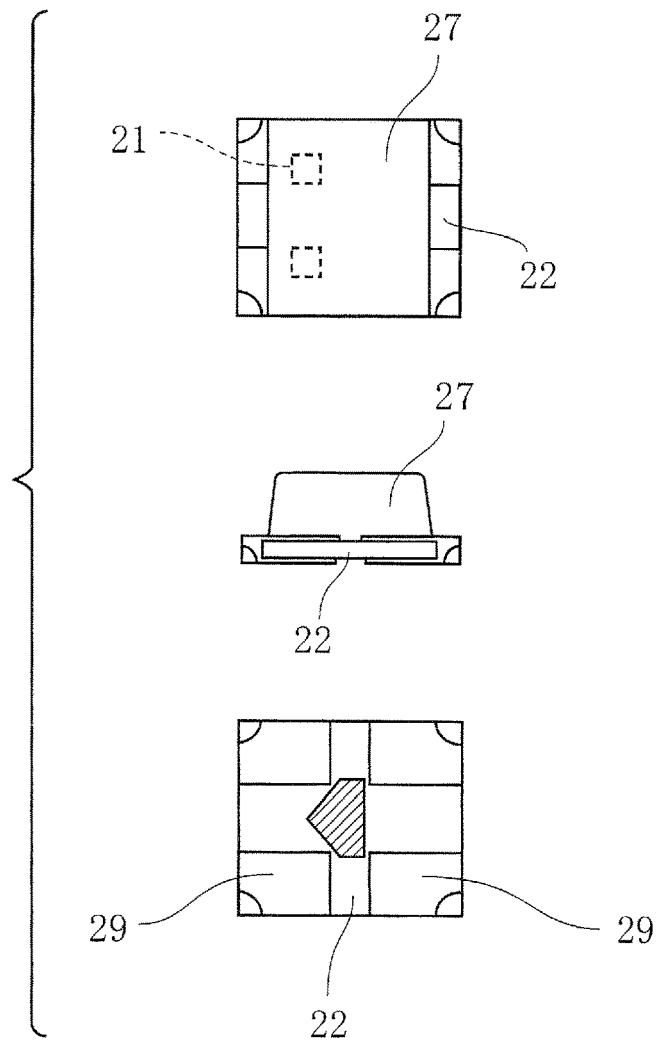
FIG. 49 is a schematic view showing the outer configuration of a variation of the third LED module.
Figure 50:
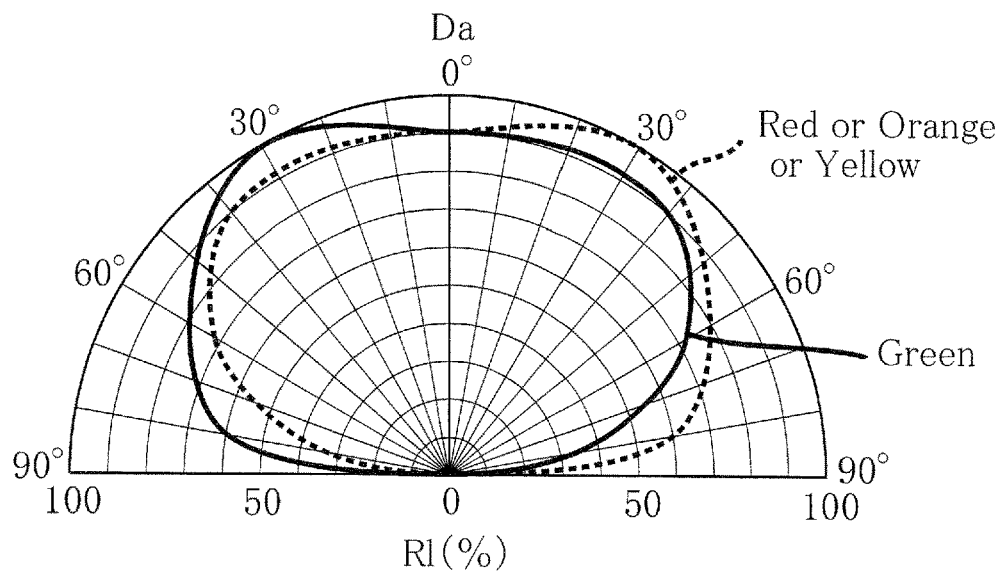
FIG. 50 shows directivity characteristics of the third LED module shown in FIG. 49.
Figure 51:
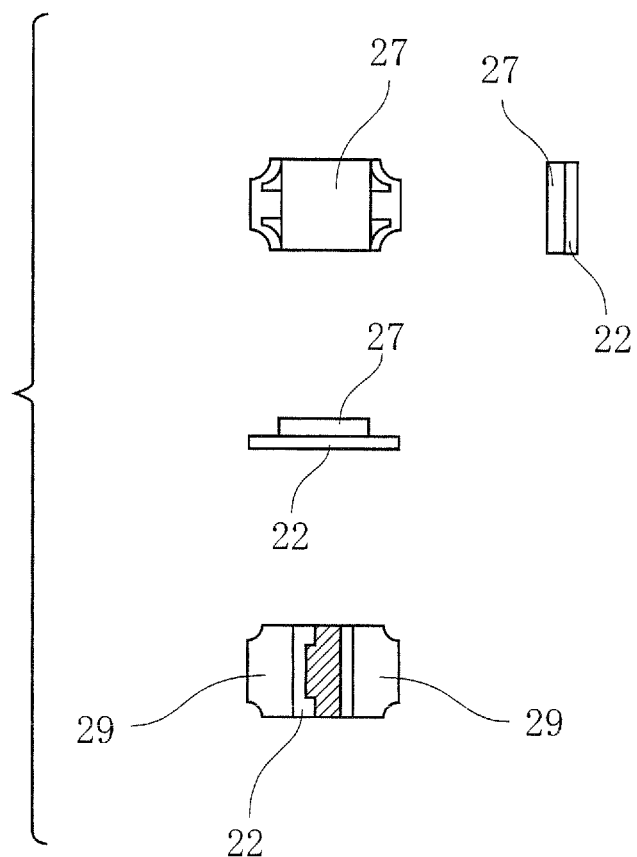
FIG. 51 is a schematic view showing the outer configuration of a variation of the third LED module.
Figure 52:
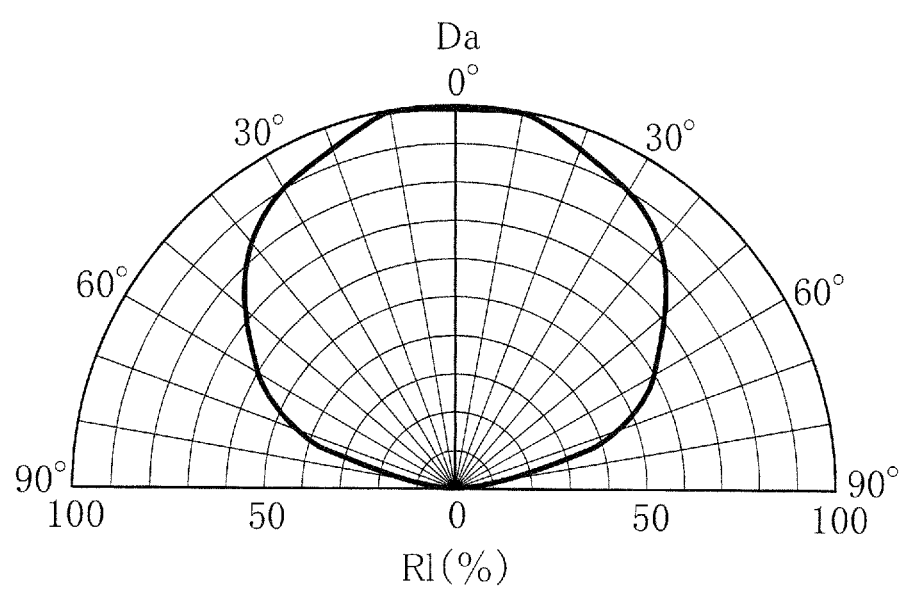
FIG. 52 shows directivity characteristics of the third LED module shown in FIG. 51.
Figure 53:
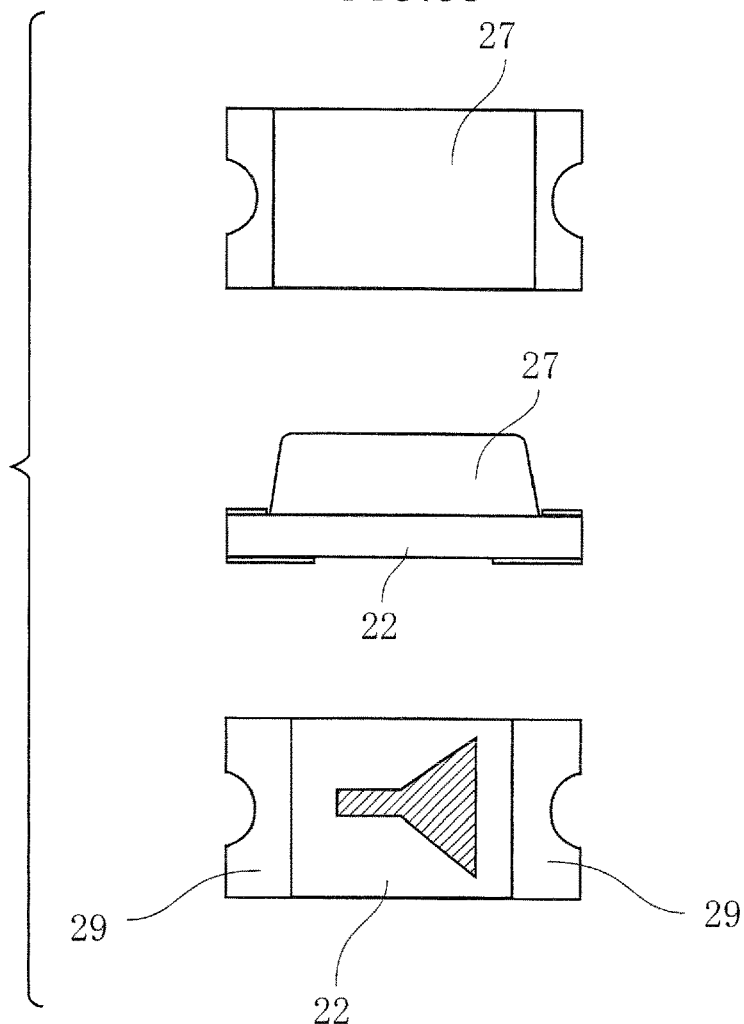
FIG. 53 is a schematic view showing the outer configuration of a variation of the third LED module.
Figure 54:
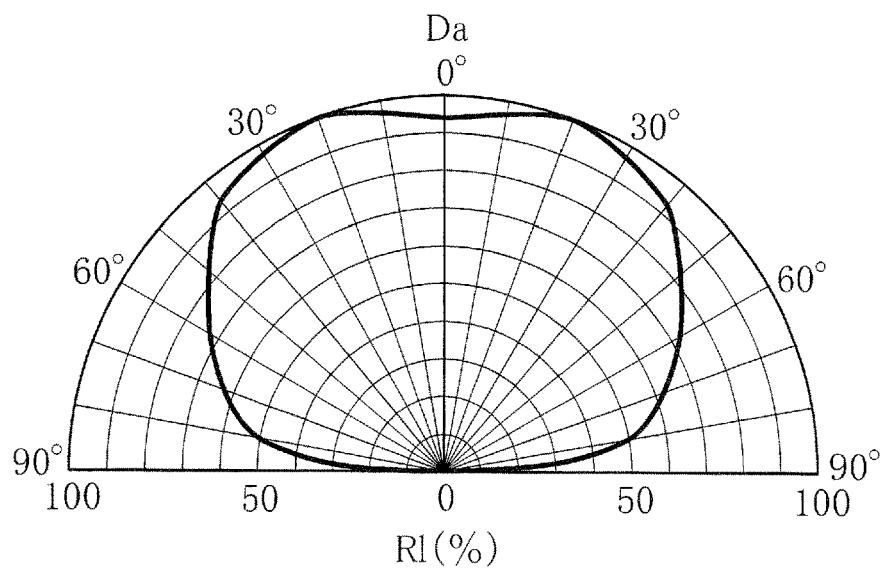
FIG. 54 shows directivity characteristics of the third LED module shown in FIG. 53.
Figure 55:
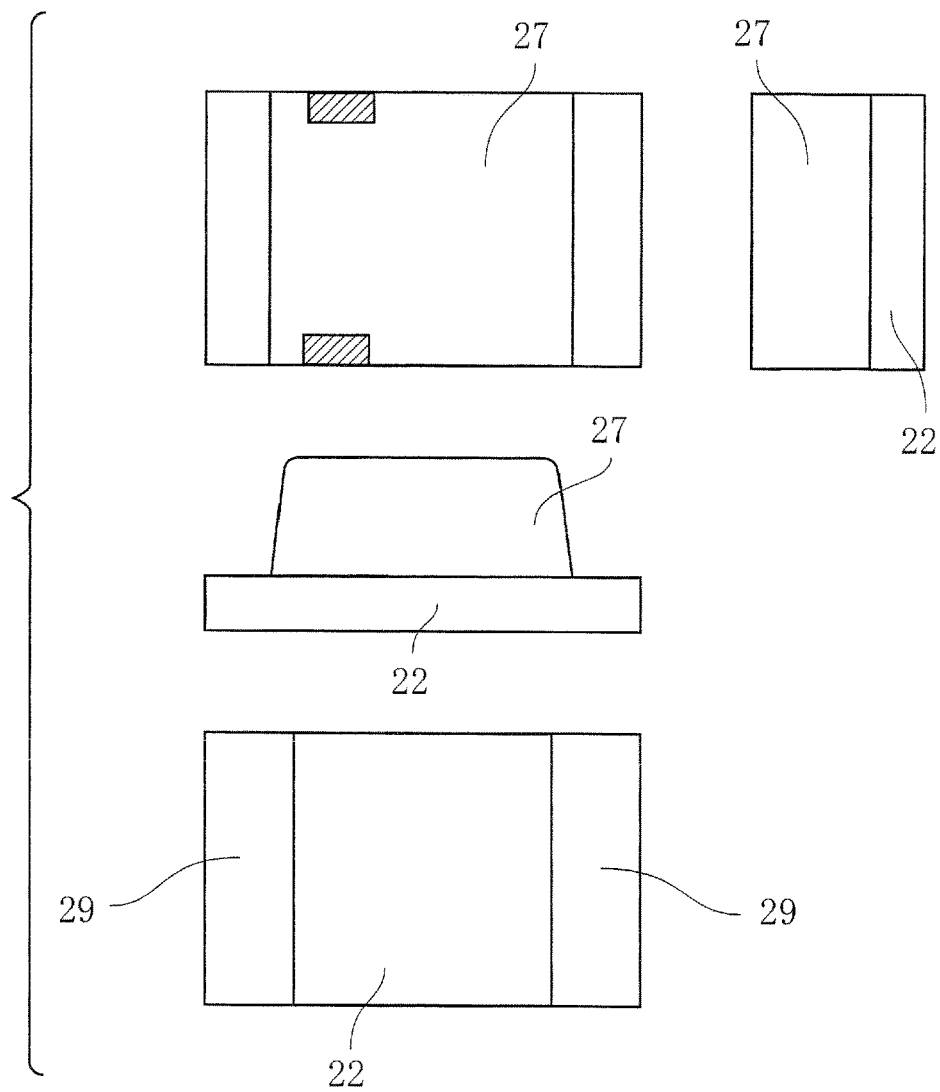
FIG. 55 is a schematic view showing the outer configuration of a variation of the third LED module.
Figure 56:
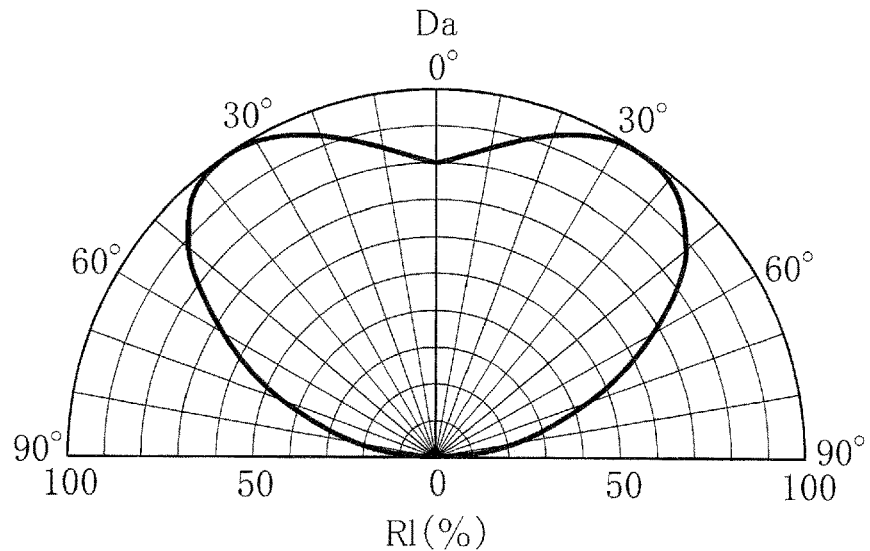
FIG. 56 shows directivity characteristics of the third LED module shown in FIG. 55.
Figure 57:
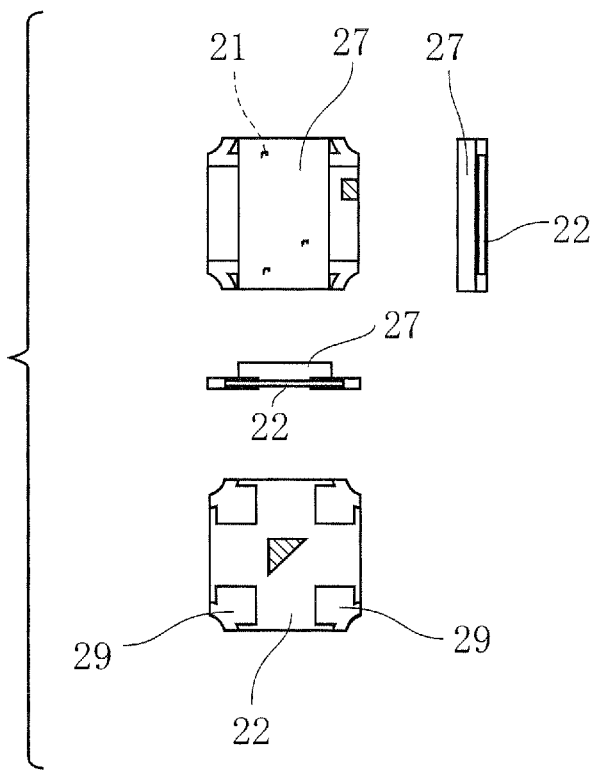
FIG. 57 is a schematic view showing the outer configuration of a variation of the third LED module.
Figure 58:
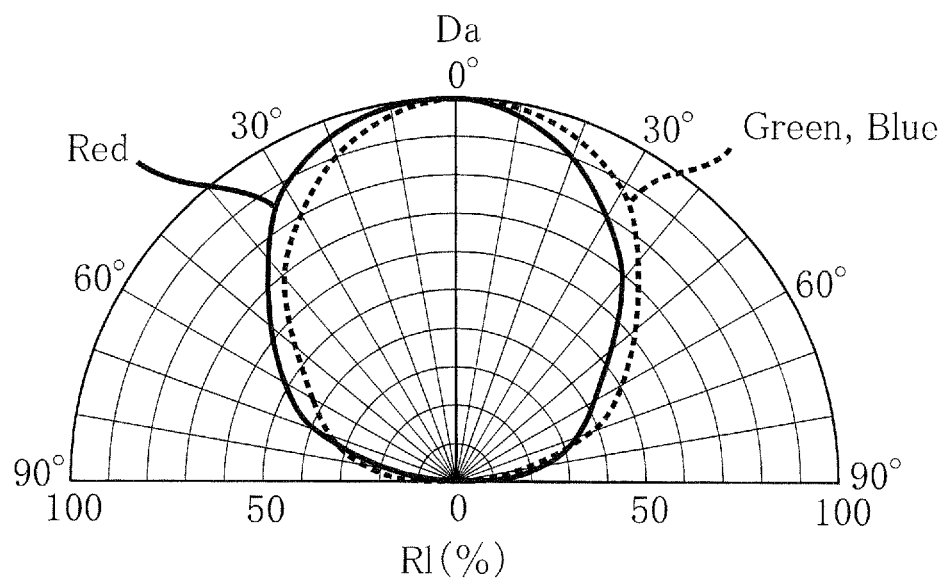
FIG. 58 shows directivity characteristics of the third LED module shown in FIG. 57.
Figure 59:
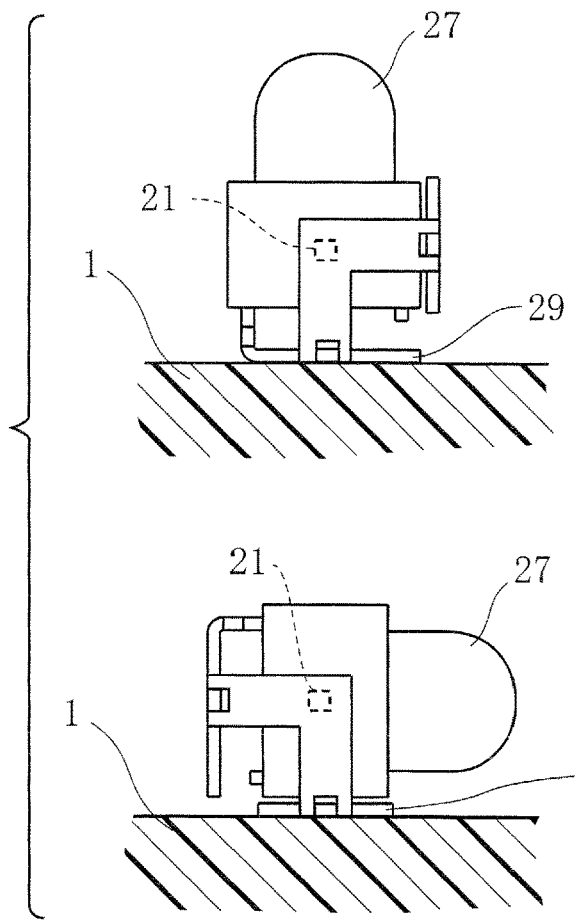
FIG. 59 is a side view showing a variation of the LED module.
Figure 60:
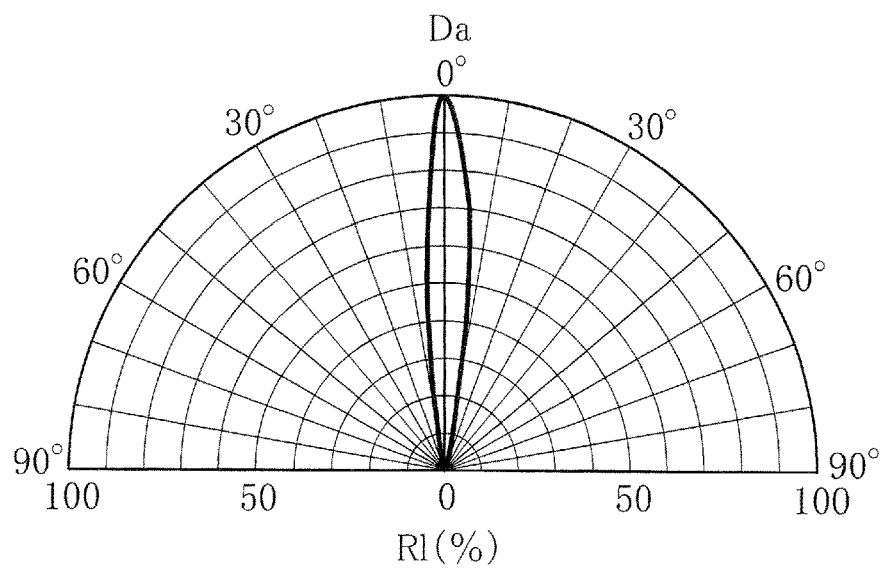
FIG. 60 shows directivity characteristics of the LED module shown in FIG. 59.
Figure 61:
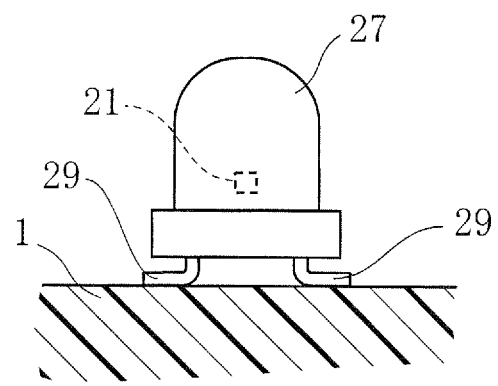
FIG. 61 is a side view showing a variation of the LED module.
Figure 62:
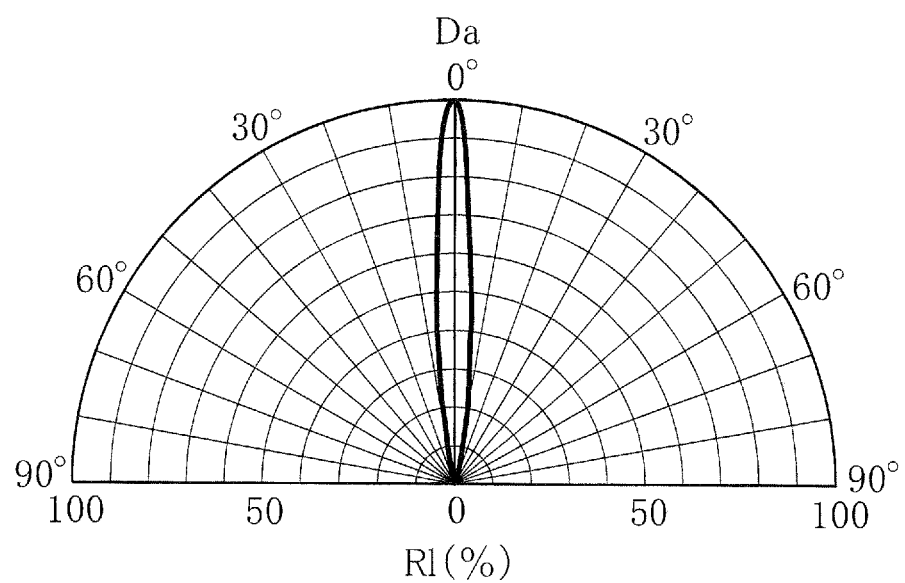
FIG. 62 shows directivity characteristics of the LED module shown in FIG. 61.
Figure 63:
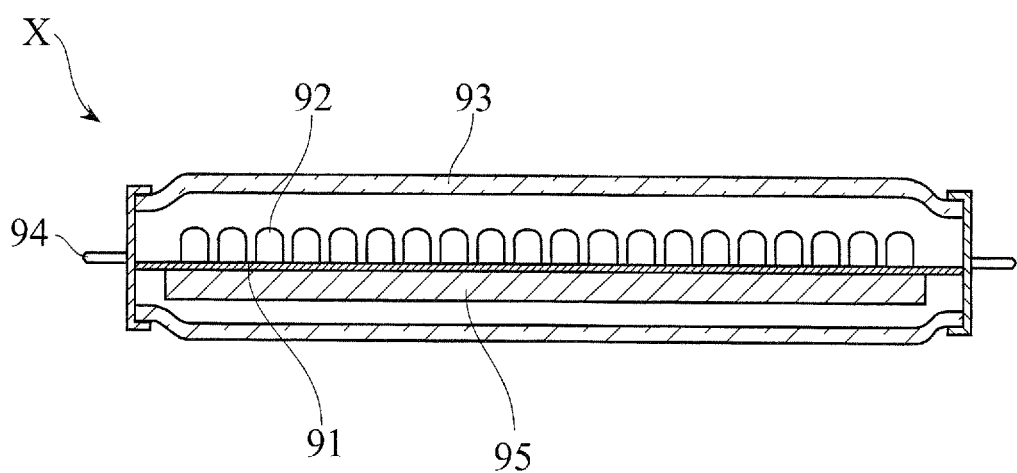
FIG. 63 is a sectional view showing an example of a conventional LED lamp.

As the first through the third LED modules 2A, 2B and 2C, the LED modules shown in FIGS. 20-58 may be employed. These figures show the schematic outer configuration or directivity characteristics of each LED module. Each view showing the outer configuration of an LED module includes, from the top, a top view, a side view and a bottom view, and a right side view on the right of the top view. FIGS. 20-32 each shows an LED module with a reflector which can be employed as the first LED module 2A. The directivity characteristics of the first LED module 2A are such that the relative intensity RI is highest at the direction angle Da of 0°. FIGS. 33-42 each shows an LED module for sideways light emission which can be employed as the second LED module 2B. The directivity characteristics of the second LED module 2B are such that the direction in which the direction angle Da=0° corresponds to the outward direction within the plane of the mount surface 1a of the support substrate 1. FIGS. 43-58 each shows an LED module with uniform intensity distribution which can be employed as the third LED module 2C. The directivity characteristics of the third LED module 2C are such that the relative intensity RI is not highest at the direction angle Da of 0°. It is to be noted that the LED modules shown in FIGS. 24 and 49 are of the type that emits two colors of light, whereas the LED modules shown in FIGS. 29, 39 and 57 are of the type that emits three colors of light.

Instead of the above-described LED modules, bullet-shaped LED modules as shown in FIGS. 59 through 62 may be employed. The bullet-shaped LED module shown in FIG. 59 can be mounted on the support substrate 1 vertically or horizontally. Thus, by appropriately selecting the mounting orientation, the direction in which the relative intensity RI is highest can be set to correspond to the direction normal to the mount surface of the support substrate 1 or to the outward direction within the plane of the mount surface. The bullet-shaped LED module shown in FIG. 61 has a simpler structure as compared with the bullet-shaped LED module shown in FIG. 59, and the directivity characteristics of this bullet-shaped LED module is such that the intensity of light is high in the direction normal to the mount surface of the support substrate 1. Instead of bullet-shaped LED modules shown in FIGS. 59 through 62, use may be made of a conventional LED module having two lead pins. In using such a conventional LED module, the LED module is mounted by guiding each lead pin through the support substrate 1 or bending each lead pin. This allows the LED module to have directivity characteristics such that the intensity of light is relatively high in the direction normal to the mount surface of the support substrate 1 or the outward direction within the plane of the mount surface of the support substrate 1.

The invention claimed is:

1. An LED lamp comprising:
   a substrate;
   a plurality of LEDs mounted on a mount surface of the substrate; and
   a light-transmitting cover covering the plurality of LEDs,
   wherein each of the plurality of LEDs comprises:
   a package body having a bottom surface;
   a first lead having a first bottom surface that is exposed from the bottom surface of the package body and a first top surface that is opposite to the first bottom surface;
   a second lead spaced apart from the first lead in a first direction and having a second bottom surface that is exposed from the bottom surface of the package body;
   an LED chip electrically connected to the first lead and the second lead; and
   a transparent sealing resin covering the LED chip,
   wherein the first bottom surface has a first area when viewed in a second direction perpendicular to the first bottom surface,
   wherein the first area has a first length in the first direction and a first width in a third direction perpendicular to the first and second directions, the first width being constant in the first direction,
   wherein the first length of the first area is larger than the first width of the first area,
   wherein the bottom surface of the package body has a width in the third direction that is larger than the first width of the first area of the first bottom surface of the first lead, and
   wherein the first bottom surface is bonded to the mount surface of the substrate.

2. The LED lamp according to claim 1, wherein an area of the first bottom surface and an area of the second bottom surface are different when viewed in a bottom view of the each on the plurality of LEDs.

3. The LED lamp according to claim 2, wherein the area of the first bottom surface is larger than the area of the second bottom surface as viewed in the bottom view of the each of the plurality of LEDs.

4. The LED lamp according to claim 1, wherein when viewed in the bottom view of the each of the plurality of LEDs, the first bottom surface and the second bottom surface are equal to each other in size along the second direction, and the first bottom surface is larger in size along the first direction than the second bottom surface.

5. The LED lamp according to claim 1, wherein the first bottom surface further has a second area that extends outward in the first direction from the first area,
the second area includes one outermost end and another outermost end that are spaced apart from each other in the third direction,
a distance from the one outermost end to the another outermost end in the third direction is equal to or larger than the first width of the first area in the third direction.

6. The LED lamp according to claim 1, wherein the first bottom surface further has second and third areas that protrudes outward in the first direction from the first area,
the second and third areas are overlapped with each other when viewed in the third direction,
the second and third areas are overlapped with the package body when viewed in the second direction.

7. The LED lamp according to claim 6, wherein a portion of the package body is exposed between the second area and the third area when viewed in the second direction.

8. The LED lamp according to claim 1, wherein the package body comprises a reflector surrounding the LED chip as viewed in the second direction and reflecting light from the LED chip to a light emitting direction such that light emitted from the LED chip has highest reflective intensity at the second direction within the light emitting direction.

9. The LED lamp according to claim 8, wherein the reflecting light has an angle spread of more than 60 degrees from the second direction.

10. The LED lamp according to claim 8, wherein the reflector is made of a white resin.

11. The LED lamp according to claim 1, wherein each of the plurality of LEDs is longer in the first direction than in the second direction,
wherein each of the plurality of LEDs is mounted such that the first direction is parallel to the longitudinal direction of the substrate.

12. The LED lamp according to claim 1, wherein the bottom surface of the package body is flush with the first bottom surface and the second bottom surface.

13. The LED lamp according to claim 1, wherein the bottom surface of the package body is in direct contact with the first bottom surface and the second bottom surface.

* * * * *